(12) United States Patent
Hayasaka et al.

(10) Patent No.: US 6,473,345 B2
(45) Date of Patent: Oct. 29, 2002

(54) SEMICONDUCTOR MEMORY DEVICE WHICH CAN BE SIMULTANEOUSLY TESTED EVEN WHEN THE NUMBER OF SEMICONDUCTOR MEMORY DEVICES IS LARGE AND SEMICONDUCTOR WAFER ON WHICH THE SEMICONDUCTOR MEMORY DEVICES ARE FORMED

(75) Inventors: Takashi Hayasaka, Hyogo (JP); Yoshikazu Miyawaki, Hyogo (JP); Atsushi Ohba, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/909,786

(22) Filed: Jul. 23, 2001

(65) Prior Publication Data

US 2002/0097611 A1 Jul. 25, 2002

(30) Foreign Application Priority Data

Jan. 23, 2001 (JP) ........................ 2001-014045

(51) Int. Cl.⁷ ................................. G11C 7/00
(52) U.S. Cl. ................. 365/191; 365/230.06
(58) Field of Search .............. 365/191, 230.06

(56) References Cited

U.S. PATENT DOCUMENTS

5,339,344 A * 8/1994 Kimura et al. ............. 377/39
5,359,566 A * 10/1994 Furuyama ................. 365/149

FOREIGN PATENT DOCUMENTS

| JP | 363091900 | * 4/1988 | ........... G11C/27/00 |
| JP | 11-211793 |   8/1999 | |

OTHER PUBLICATIONS

Betty Prince, "Semiconductor Memories", 1983, Wiley, pp. 163–164.*

* cited by examiner

Primary Examiner—M. Tran
(74) Attorney, Agent, or Firm—McDermott, Will & Emery

(57) ABSTRACT

At the time of writing data, a tester outputs a chip enable signal /CE of the L level and selection signals of the L level to simultaneously make semiconductor memory devices active. At the time of reading data, the tester outputs the chip enable signal of the L level to the semiconductor memory devices, and selectively switches the logic level of a selection signal to be outputted to some semiconductor memory devices and that of the selection signal to be outputted to the other semiconductor memory devices to the L level. In such a manner, a number of semiconductor memory devices can be tested without increasing the number of pins of the tester.

20 Claims, 21 Drawing Sheets

FIG.14
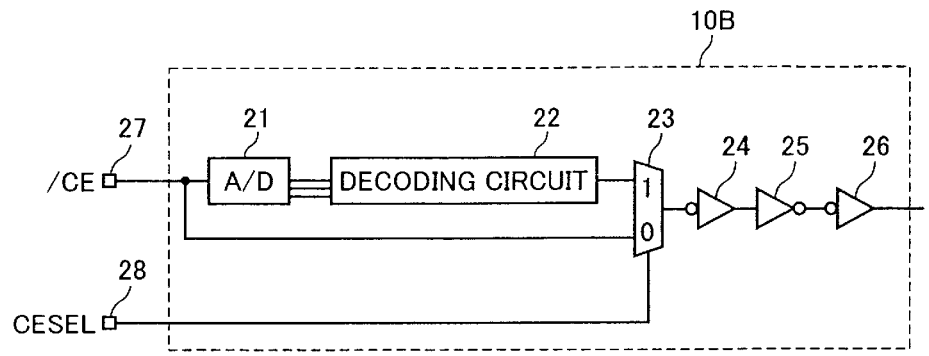
FIG.15
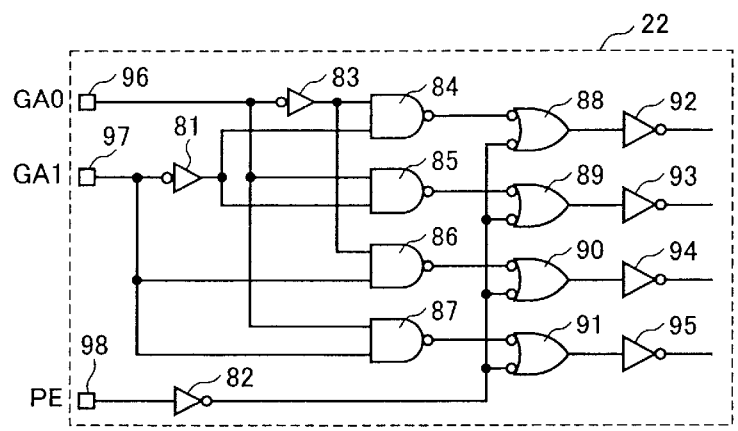
FIG.16
| /CE | PE | GA0 | GA1 |
|---|---|---|---|
| 0V | 1 | 1/0 | 1/0 |
| 0.5V | 0 | 1 | 1 |
| 1.0V | 0 | 0 | 1 |
| 1.5V | 0 | 1 | 0 |
| 2.0V | 0 | 0 | 0 |

SEMICONDUCTOR MEMORY DEVICE WHICH CAN BE SIMULTANEOUSLY TESTED EVEN WHEN THE NUMBER OF SEMICONDUCTOR MEMORY DEVICES IS LARGE AND SEMICONDUCTOR WAFER ON WHICH THE SEMICONDUCTOR MEMORY DEVICES ARE FORMED

BACKGROUND OF THE INVENTION

1. Field of the Invention

The present invention relates to semiconductor memory devices which can be simultaneously tested even when the number of them is large and a semiconductor wafer on which the semiconductor memory devices are formed.

2. Description of the Background Art

A semiconductor memory device (also called a "semiconductor memory chip") on which memory cells for inputting/outputting data are arranged in a matrix is subjected to processes shown in FIG. 22 and then shipped. Specifically, referring to FIG. 22, a wafer process for forming a number of semiconductor memory chips on a semiconductor wafer such as a silicon (Si) wafer by an LSI process is performed (step S1). At a stage when the wafer process is finished, as shown in FIG. 23, a semiconductor wafer 700 has device areas 701 on which the semiconductor memory chips are formed and areas 702 on which no semiconductor memory chip is formed. The device areas 701 are arranged in a grid pattern.

An operation test for each of the semiconductor memory chips is conducted on the semiconductor wafer on which the semiconductor memory chips are formed as shown in FIG. 23 (step S2). After that, semiconductor memory chips determined as non-defective by the operation test are separated by cutting the semiconductor wafer 700 along the areas 702 in which no semiconductor memory chip, and an assembling process of packaging the chips is carried out (step S3). In a packaged state, an operation test is conducted again on each of the semiconductor memory chips (step S4), and only the semiconductor memory chips which passed the operation test are shipped.

The operation tests in step S2 and S4 are, as shown in FIG. 24, a writing test (step S5) for writing data into each of the memory cells and a reading test (step S6) for reading the written data and confirming that the read data coincides with the written data.

The operation test on each of the semiconductor memory chips is carried out by, as shown in FIG. 25, connecting a plurality of semiconductor memory chips to a tester. A tester 800 has a signal generating circuit 801, an address generating circuit 803, data generating circuits 805, 809, 813, and 817, determining circuits 807, 811, 815, and 819, drivers 802, 804, 806, 810, 814, and 818, and comparators 808, 812, 816, and 820. The signal generating circuit 801 generates a chip enable signal /CE for activating semiconductor memory chips 901 to 904. The driver 802 converts the chip enable signal /CE generated by the signal generating circuit 801 to a voltage value indicative of the H (logical high) level or the L (logical low) level and outputs the voltage value to the semiconductor memory chips 901 to 904. The address generating circuit 803 generates an address for designating one of memory cells (not shown) arranged in a matrix in each of the semiconductor memory chips 901 to 904. The driver 804 converts the address generated by the address generating circuit 803 into a voltage value indicative of the address and outputs the voltage value to the semiconductor memory chips 901 to 904.

The data generating circuits 805, 809, 813, and 817 generate data to be written into the semiconductor memory chips 901 to 904 at the time of the writing test in the operation test. Each of the drivers 806, 810, 814, and 818 converts the data generated by the data generating circuits 805, 809, 813, and 817 into a voltage value indicative of "1" or "0" and outputs the voltage value to the semiconductor memory chips 901 to 904, respectively.

Each of the comparators 808, 812, 816, and 820 compares data read from the semiconductor memory chips 901 to 904 with a predetermined level at the time of the reading test in the operation test and converts the data to the logical value "1" or "0". Each of the determining circuits 807, 811, 815, and 819 compares data supplied from the comparators 808, 812, 816, and 820 with data generated at the time of the writing test by the data generating circuits 805, 809, 813, and 817 and determines whether the read data coincides with the write data or not.

The semiconductor memory chip 901 has a control terminal 905, an address terminal 906, and a data terminal 907. The semiconductor memory chip 902 has a control terminal 908, an address terminal 909, and a data terminal 910. The semiconductor memory chip 903 has a control terminal 911, an address terminal 912, and a data terminal 913. The semiconductor memory chip 904 has a control terminal 914, an address terminal 915, and a data terminal 916. The control terminals 905, 908, 911, and 914 are terminals for supplying the chip enable signal /CE to the semiconductor memory chips 901 to 904, respectively. The address terminals 906, 909, 912, and 915 are terminals for supplying an address to the semiconductor memory chips 901 to 904, respectively. The data terminals 907, 910, 913, and 916 are terminals for inputting/outputting data from/to the semiconductor memory chips 901 to 904, respectively.

In FIG. 25, although not shown in detail, each of the address terminals 906, 909, 912, and 915 is comprised of 22 terminals, and each of the data terminals 907, 910, 913, and 916 is comprised of 16 terminals. FIG. 25 shows a case where the operation test is conducted simultaneously on the four semiconductor memory chips 901 to 904.

Each of the semiconductor memory chips 901 to 904 has an activating/inactivating circuit 920 shown in FIG. 26. Referring to FIG. 26, the activating/inactivating circuit 920 has inverters 921 to 923. The chip enable signal /CE outputted from the driver 802 of the tester 800 is supplied via each of the control terminals 905, 908, 911, and 914 of the semiconductor memory chips 901 to 904 to the activating/inactivating circuit 920. The activating/inactivating circuit 920 inverts the logic of the supplied chip enable signal /CE three times, that is, inverts the logic of the supplied chip enable signal /CE and outputs the inverted logic. When the chip enable signal /CE of the L level is entered, the activating/inactivating circuit 920 therefore outputs a signal of the H level to activate the semiconductor memory chips 901 to 904. When the chip enable signal /CE of the H level is entered, the activating/inactivating circuit 920 outputs a signal of the L level to make the semiconductor memory chips 901 to 904 inactive.

Referring to FIGS. 25 and 27, an operation of conducting an operation test simultaneously on the semiconductor memory chips 901 to 904 will be described. In a period T1, data is written to the semiconductor memory chips 901 to 904. In a period T2, data is read from the semiconductor memory chips 901 to 904.

In the period T1, the signal generating circuit 801 in the tester 800 generates the chip enable signal /CE of the L level, and the driver 802 converts the signal to a voltage value indicative of the chip enable signal /CE of the L level and outputs the voltage value. The chip enable signal /CE of the L level is supplied to the semiconductor memory chips 901 to 904 via the control terminals 905, 908, 911, and 914 to activate each of the semiconductor memory chips 901 to 904. After that, a write enable signal /WE is generated by a signal generating circuit (not shown) and supplied from a control terminal (not shown) to make the semiconductor memory chips 901 to 904 enter a data writable state.

The address generating circuit 803 generates an address "Address" to designate one of the memory cells arranged in the matrix in each of the semiconductor memory chips 901 to 904, and the driver 804 converts the generated address "Address" to a voltage value and outputs the voltage value. The address "Address" outputted from the tester 800 is supplied via the address terminals 906, 909, 912, and 915 to the semiconductor memory chips 901 to 904, respectively, which are sequentially activated in accordance with the address "Address" indicative of a plurality of memory cells included in the semiconductor memory chips 901 to 904. After that, the data generating circuit 805 generates data "Data" to be written to the semiconductor memory chip 901, and the driver 806 converts the generated data "Data" into a voltage value and the outputs the voltage value. The data "Data" outputted from the tester 800 is supplied via the data terminal 907 to the semiconductor memory chip 901 and is written in the activated memory cell.

Similarly, the data generating circuits 809, 813, and 817 generate write data "Data", and the drivers 810, 814, and 818 convert the data "Data" to a voltage value and outputs the voltage value. The data "Data" outputted from the tester 800 is supplied via the data terminals 910, 913, and 916 to the semiconductor memory chips 902 to 904 and is written in the activated memory cells.

After finishing the writing of the data "Data" to the semiconductor memory chips 901 to 904, in the period T2, the data "Data" is read from the semiconductor memory chips 901 to 904. In this case as well, first, the chip enable signal /CE is generated by the signal generating circuit 801 in the tester 800, and the semiconductor memory chips 901 to 904 are activated by a method similar to the above. The signal generating circuit (not shown) in the tester 800 generates the output enable signal /OE, and the semiconductor memory chips 901 to 904 receive the output enable signal /OE from the control terminal (not shown) and enter a data "Data" outputtable state. After that, the address generating circuit 803 generates the address "Address". The generated address "Address" is supplied to the semiconductor memory chips 901 to 904 by a method similar to the above to activate each of the memory cells in the semiconductor memory chips 901 to 904. The semiconductor memory chip 901 outputs data Data0 read from each memory cell to the comparator 808 from the data terminal 907. The comparator 808 compares the data Data0 received from the semiconductor memory chip 901 with a predetermined level to thereby convert the data to data "1" or "0", and outputs the data "1" or "0" to the determining circuit 807. The determining circuit 807 compares the data "1" or "0" from the comparator 808 with the data "1" or "0" generated by the data generating circuit 805 to determine whether the data "1" or "0" written in the semiconductor chip 901 is read or not.

The semiconductor memory chip 902 outputs the data Data1 read from the memory cell from the data terminal 910 to the comparator 812. The comparator 812 compares input data Data1 with a predetermined level, converts it to data "1" or "0", and outputs the resultant data to the determining circuit 811. The determining circuit 811 compares the data "1" or "0" from the comparator 812 with the data "1 or "0" generated by the data generating circuit 809, thereby determining whether the data"1" or "0" written in the semiconductor memory chip 902 has been read or not.

Data Data2 and Data3 read from the semiconductor memory chips 903 and 904 is also subjected to the determining operation of the determining circuits 815 and 819, respectively, in a manner similar to the above.

In the conventional test method, however, when the number of semiconductor memory chips to be tested simultaneously is increased, it is necessary to increase the number of drivers for data and the number of pins of comparators in the tester. In some testers, the number of pins cannot be increased due to restriction on the tester. Consequently, a problem such that the efficiency of a test cannot be increased occurs.

When a new tester has to be purchased to increase the number of pins for testing, investment is newly required, and a problem such that the manufacturing cost of the semiconductor memory chip increases arises.

SUMMARY OF THE INVENTION

It is therefore an object of the invention to provide semiconductor memory devices which can be simultaneously tested even when the number of them is large without increasing the number of pins in a tester and a semiconductor wafer on which the semiconductor memory devices are formed.

According to the invention, a semiconductor memory device has: a plurality of memory cells: input/output terminals for inputting/outputting data; an address terminal for receiving an address for making each of the plurality of memory cells active; a plurality of control terminals provided in correspondence with a plurality of control signals, for receiving the plurality of control signals; an activating/inactivating circuit for receiving the plurality of control signals and outputting an activation signal or an inactivation signal in accordance with logic of the plurality of control signals; an address decoder for decoding an address supplied via the address terminal on the basis of the activate signal and making each of the plurality of memory cells active on the basis of the decoded address; and an input/output circuit for inputting/outputting data to/from the memory cell activated by the address decoder on the basis of the activate signal.

Preferably, the activating/inactivating circuit outputs the activation signal when all of the plurality of control signals have a first logic, and outputs the inactivation signal when at least one of the plurality of control signals has a second logic.

Preferably, in normal operation, the activating/inactivating circuit outputs the activation signal or the inactivation signal in accordance with the logic of one of the plurality of control signals.

Preferably, the activating/inactivating circuit outputs the activation signal or the inactivation signal by performing an operation to obtain a logical product of the plurality of control signals.

Preferably, the plurality of control signals are a chip enable signal as one of the control signals and a selection signal, and the selection signal is held in the first logic.

Preferably, the input/output circuit includes an output circuit for outputting output data from each of the plurality of memory cells as a digital signal.

According to the invention, a semiconductor memory device has: a plurality of memory cells: input/output terminals for receiving/outputting data; an address terminal for receiving an address for making each of the plurality of memory cells active; a first control terminal for receiving a first control signal; a second control terminal for receiving a second control signal; an activating/inactivating circuit for receiving the second control signal as a logical signal when the first control signal has a first logic and outputting an activation signal or an inactivation signal in accordance with the logic of the second control signal, for receiving the second control signal as an analog signal when the first control signal has a second logic and outputting the activation signal or the inactivation signal in accordance with the value of the analog signal; an address decoder for decoding an address supplied via the address terminal on the basis of the activation signal and making each of the plurality of memory cells active on the basis of the decoded address; and an input/output circuit for inputting/outputting data to/from the memory cell activated by the address decoder on the basis of the activation signal.

Preferably, the activating/inactivating circuit includes: a selection signal generating circuit for generating a selection signal of a first or second logic in accordance with the value of the analog signal; a selecting circuit for selecting the second control signal as the logic signal when the first control signal has the first logic and selecting the selection signal when the first control signal has the second logic; and a signal outputting circuit for outputting the activation signal when the selected second control signal or selection signal has the first logic, and outputting the inactivation signal when the selected second control signal or selection signal has the second logic.

Preferably, the selection signal generating circuit has: an AD converter for converting the analog signal to a digital signal having a digital value which varies according to the value of the analog signal; and a decoding circuit for generating the selection signal on the basis of the digital signal.

Preferably, in normal operation, the first control signal is held in the first logic.

Preferably, the input/output circuit includes an output circuit for outputting output data from each of the plurality of memory cells as a digital signal.

According to the invention, a semiconductor wafer including a plurality of first semiconductor memory devices arranged in the (2n−1)th row (where n is a natural number), a plurality of second semiconductor memory devices arranged in the 2n-th row, and cutting areas, wherein each of the plurality of first semiconductor memory devices includes: a plurality of first memory cells; a first input/output terminal for inputting/outputting data; a first address terminal for receiving an address for making each of the plurality of first memory cells active; a first control terminal for receiving a first control signal for generating an activation signal at the time of writing the data; a second control terminal for receiving a second control signal for generating an activation signal at the time of reading the data; a first activating/inactivating circuit for outputting an activation or inactivation signal in accordance with the logic of the first or second control signal; a first address decoder for decoding an address received via the address terminal on the basis of the activation signal and activating each of the plurality of memory cells on the basis of the decoded address; and a first input/output circuit for inputting/outputting data from/to a memory cell activated by the address decoder on the basis of the activation signal, and each of the plurality of second semiconductor memory devices includes: a plurality of second memory cells; a second input/output terminal for receiving/outputting data; a second address terminal for receiving an address for making each of the plurality of second memory cells active; a third control terminal connected to the second control terminal by an interconnection via the cutting area; a second activating/inactivating circuit for outputting an activation signal or an inactivation signal in accordance with logic of the second control signal; a second address decoder for decoding an address supplied via the address terminal on the basis of the activation signal and making each of the plurality of memory cells active on the basis of the decoded address; and a second input/output circuit for inputting/outputting data to/from the memory activated by the address decoder on the basis of the activation signal.

Preferably, the first activating/inactivating circuit outputs the activation signal when the first control signal has a first logic or when the second control signal has a first logic, and the second activating/inactivating circuit outputs the activation signal when the second control signal has a second logic.

Preferably, the first activating/inactivating circuit outputs the inactivation signal when the first and second control signals have a second logic, and the second activating/inactivating circuit outputs the inactivation signal when the second control signal has a first logic.

According to the invention, a semiconductor wafer having a plurality of areas each including a plurality of semiconductor memory devices, and a cutting area, wherein the cutting area includes a selection signal generating circuit for generating a selection signal for activating a plurality of semiconductor memory devices included in each of the plurality of areas in response to logic of a plurality of first control signals, and each of the plurality of semiconductor memory devices includes: a plurality of memory cells; an input/output terminal for inputting/outputting data; an address terminal for receiving an address for making each of the plurality of first memory cells active; a control terminal for receiving the selection signal generated by the selection signal generating circuit; an activating/inactivating circuit for receiving the selection signal and outputting an activation or inactivation signal in response to the logic of the selection signal; an address decoder for decoding an address received via the address terminal on the basis of the activation signal and activating each of the plurality of memory cells on the basis of the decoded address; and an input/output circuit for inputting/outputting data from/to a memory cell activated by the address decoder on the basis of the activation signal.

Preferably, the selection signal generating circuit generates selection signals of the number corresponding to the plurality of areas.

Preferably, at the time of writing data, the selection signal generating circuit generates the selection signal so as to simultaneously make all of semiconductor memory devices active, and at the time of reading data, generates the selection signal so as to make a plurality of semiconductor memory devices included in each of the plurality of areas on the area unit basis.

Preferably, the activating/inactivating circuit outputs the activation signal when the selection signal has a first logic.

Preferably, each of the plurality of semiconductor memory devices has one more control terminal for receiving a chip enable signal, and the activating/inactivating circuit outputs the activation signal or the inactivation signal by performing an operation to obtain a logical product of the chip enable signal and the selection signal.

According to the invention, a semiconductor wafer having a plurality of semiconductor memory devices each including a plurality of memory cells and a cutting area, wherein each of the plurality of semiconductor memory devices includes: an output circuit for outputting read data from the plurality of memory cells as a digital signal; and an input circuit for writing write data into the plurality of memory cells, and the cutting area includes: an input/output switching circuit for converting a digital signal from the output circuit into an analog signal, outputting the read data as an analog signal, and supplying the write data to the input circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a block diagram and circuit diagram of an activating/inactivating circuit of the semiconductor memory device shown in FIG. 13;

FIG. 15 is a circuit diagram of a decoding circuit in the activating/inactivating circuit shown in FIG. 14;

FIG. 16 is a chart showing the relation between analog and digital signals in an A/D converter in the activating/ inactivating circuit illustrated in FIG. 14;

DESCRIPTION OF THE PREFERRED EMBODIMENTS

Figure 1:
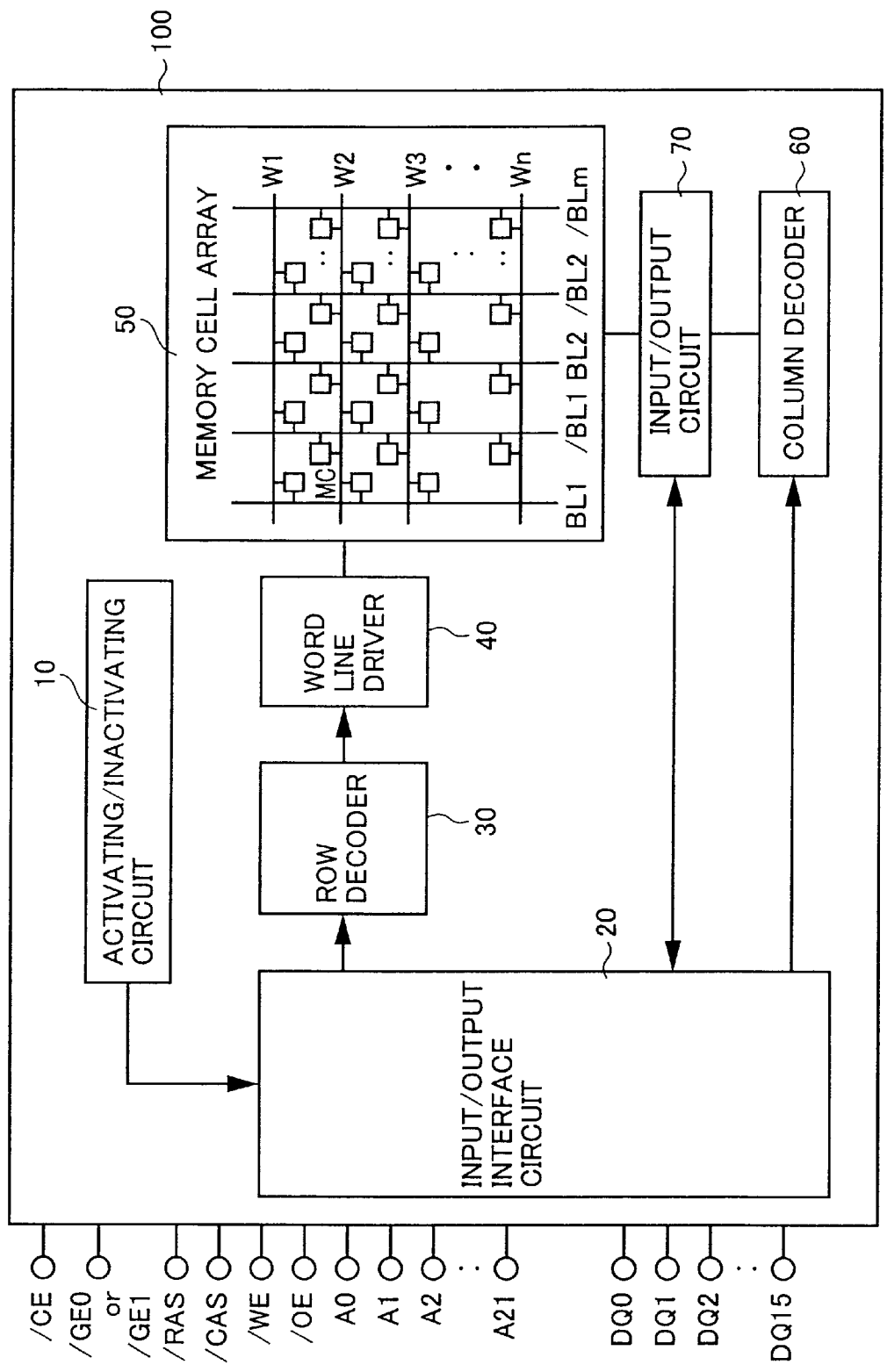
FIG. 1 is a schematic block diagram showing the configuration of a semiconductor memory device according to a first embodiment of the invention.

Embodiments of the invention will be described in detail hereinbelow with reference to the drawings. The same or corresponding components are designated by the same reference numerals and their description will not be repeated.

First Embodiment

The configuration of a semiconductor memory device 100 according to a first embodiment of the invention will be described with reference to FIG. 1. The semiconductor memory device 100 has an activating/inactivating circuit 10, an input/output interface circuit 20, a row decoder 30, a word line driver 40, a memory cell array 50, a column decoder 60, and an input/output circuit 70.

The activating/inactivating circuit 10 generates an activation or inactivation signal on the basis of the chip enable signal /CE and a selection signal GE0 or GE1, and outputs the generated activation or inactivation signal to the input/ output interface circuit 20.

The input/output interface circuit 20 receives controls signals such as a row address strobe signal /RAS, a column address strobe signal /CAS, a write enable signal /WE, and an output enable signal /OE, outputs the row address strobe signal /RAS to the row decoder 30, outputs the column address strobe signal /CAS to the column decoder 60, and outputs the write enable signal/ WE and the output enable signal /OE to the input/output circuit 70. The input/output interface circuit 20 also receives addresses via address pins A0 to A21 and outputs the input addresses to the row decoder 30 and the column decoder 60. Further, the input/ output interface circuit 20 receives data via input/output pins DQ0 to DQ15, outputs the received data to the input/output circuit 70, receives output data read from a memory cell MC in the memory cell array 50 from the input/output circuit 70, and outputs the received output data to the input/output pins DQ0 to DQ15.

The row decoder 30 decodes the address received from the input/output interface circuit 20 to generate a row address, and outputs the generated row address to the word line driver 40. The word line driver 40 selectively activates word lines W1 to Wn in the memory cell array 50 on the basis of the row address received from the row decoder 30. The memory cell array 50 has a plurality of memory cells MC, the plurality of word lines W1 to Wn arranged in the row direction, and a plurality of bit line pairs BL1 and /BL1 to BLm and /BLm arranged in the column direction. The plurality of memory cells MC are arranged in positions where the word lines W1 to Wn and the bit line pairs BL1 and /BL1 to BLm and /BLm cross each other. Consequently, by selectively activating the word lines W1 to Wn and the bit line pairs BL1 and /BL1 to BLm and /BLm, data can be inputted/outputted to/from the memory cell MC disposed in the position where the activated one of the word lines W1 to Wn and the activated one of the bit line pairs BL1 and /BL1 to BLm and /BLm cross each other.

The column decoder 60 decodes the address from the input/output interface circuit 20 to generate a column address, and outputs the generated column address to the input/output circuit 70. The input/output circuit 70 includes a sense amplifier and a pre-amplifier, selectively activates the bit line pairs BL1 and /BL1 to BLm and /BLm on the basis of the column address from the column decoder 60, writes data from the input/output interface circuit 20 into the memory cell MC, amplifies the data read from the memory cell MC, and outputs the amplified data to the input/output interface circuit 20.

Figure 2:
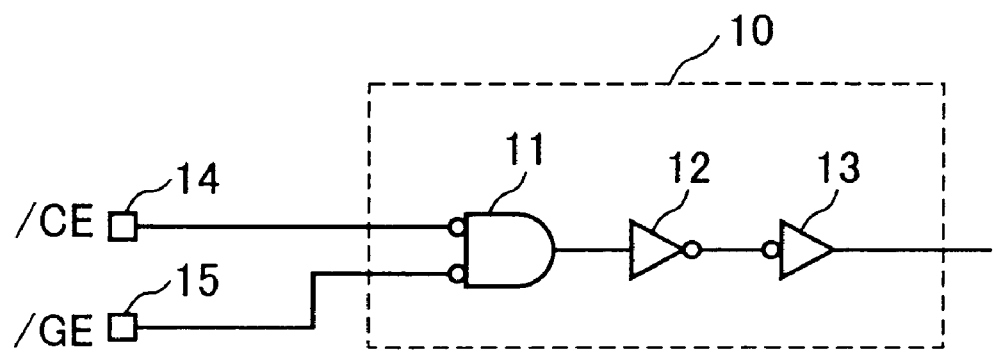
FIG. 2 is a circuit diagram of an activating/inactivating circuit in the semiconductor memory device shown in FIG. 1.

Referring to FIG. 2, the activating/inactivating circuit 10 has an NOR gate 11 and inverters 12 and 13. On the basis of the chip enable signal /CE supplied from the pad 14 and the selection signal GE (which is either a selection signal GE0 or GE1) supplied from the pad 15, the NOR gate 11 executes a logical operation on the two signals. The inverters 12 and 13 invert an input signal. The chip enable signal /CE goes low (L level) to make the semiconductor memory device 100 active and goes high (H level) to make the semiconductor memory device 100 inactive. At the time of an operation test, the semiconductor memory device 100 is activated. Consequently, the activating/inactivating circuit 10 receives the chip enable signal /CE of the L level from the pad 14. When the selection signal /GE of the H level is input, the NOR gate 11 outputs an L level signal, the inverter 12 outputs an H level signal, and the inverter 13 outputs an L level signal. In this case, therefore, the activating/inactivating circuit 10 outputs an inactivation signal. On the other hand, when the selection signal /GE of the L level is input, the NOR gate 11 outputs an H level signal, the inverter 12 outputs an L level signal, and the inverter 13 outputs an H level signal. In this case, therefore, the activating/inactivating circuit 10 outputs an activation signal. When the chip enable signal /CE of the H level is input, irrespective of the level of the selection signal /GE, the activating/inactivating circuit 10 outputs an inactivation signal of the L level.

Referring again to FIG. 1, the writing/reading operations of data to/from the memory cell array 50 will be described. First, the writing operation will be described. When the chip enable signal /CE of the L level and the selection signal /GE0 or /GE1 of the L level are input, the activating/inactivating circuit 10 outputs the activation signal of the H level to the input/output interface circuit 20. The input/output interface circuit 20 is activated by the activation signal from the activating/inactivating circuit 10, outputs the row address strobe signal /RAS and the column address strobe signal /CAS supplied via terminals to the row decoder 30 and the column decoder 60 to thereby make the row decoder 30 and the column decoder 60 active. After that, when the write enable signal /WE is input via a terminal, the input/output interface circuit 20 outputs the write enable signal /WE to the input/output circuit 70 to make the input/output circuit 70 active.

When an address is input via the address pins A0 to A21, the input/output interface circuit 20 outputs the input address to the row decoder 30 and the column decoder 60. The row decoder 30 decodes the address from the input/output interface circuit 20 to generate a row address and outputs the generated row address to the word line driver 40. The word line driver 40 activates one of the word lines W1 to Wn, which is designated by the row address from the row decoder 30. On the other hand, the column decoder 60 decodes the address from the input/output interface circuit 20 to generate a column address, and outputs the generated column address to the input/output circuit 70. After that, when data is input via the input/output pins DQ0 to DQ15, the input/output interface circuit 20 outputs the input data to the input/output circuit 70. The input/output circuit 70 activates one of the bit line pairs BL1 and /BL1 to BLm and /BLm, which is designated by the column address from the column decoder 60, and writes data from the input/output interface circuit 20 to the activated bit line pair. By the operations, the data is written in the memory cell MC disposed in the position where the activated word line and the activated bit line pair cross each other.

The operation of reading data from the memory cell MC will now be described. The operations of supplying the chip enable signal /CE of the L level and the selection signal GE0 or GE1 of the L level to make the input/output interface circuit 20 active and supplying the row address strobe signal /RAS and the column address strobe signal /CAS to make the row decoder 30 and the column decoder 60 active are the same as those in the case of the writing operation. After that, when the output enable signal /OE is input, the input/output interface circuit 20 outputs the output enable signal /OE to the input/output circuit 70. When the address is input, the input/output interface circuit 20 outputs the address to both the row decoder 30 and the column decoder 60. The row decoder 30 decodes the address to generate a row address, and outputs the generated row address to the word line drier 40. The column decoder 60 decodes the address to generate a column address and outputs the generated column address to the input/output circuit 70. The input/output circuit 70 makes one of the bit line pairs BL1 and /BL1 to BLm and /BLm active, which is designated by the column address from the column decoder 60, amplifies the data from the activated bit line pair, and outputs the amplified data to the input/output interface circuit 20. The input/output interface circuit 20 outputs the data from the input/output circuit 70 to the input/output pins DQ0 to DQ15. In such a manner, the data is read from the memory cell MC disposed in the position where the word line and the bit line pair cross each other.

As described above, in the semiconductor memory device 100, by the activation signal outputted from the activating/inactivating circuit 10 on the basis of the chip enable signal /CE of the L level and the selection signal GE0 or GE1 of the L level, the input/output interface circuit 20 is activated. When the input/output interface circuit 20 is activated, the row address strobe signal /RAS, column address strobe signal /CAS, write enable signal /WE, output enable signal /OE, and address are supplied and the data is inputted/outputted. Consequently, the row decoder 30, word line driver 40, column decoder 60, and input/output circuit 70 are activated in response to the activation signal outputted from the activating/inactivating circuit 10.

Figure 3:
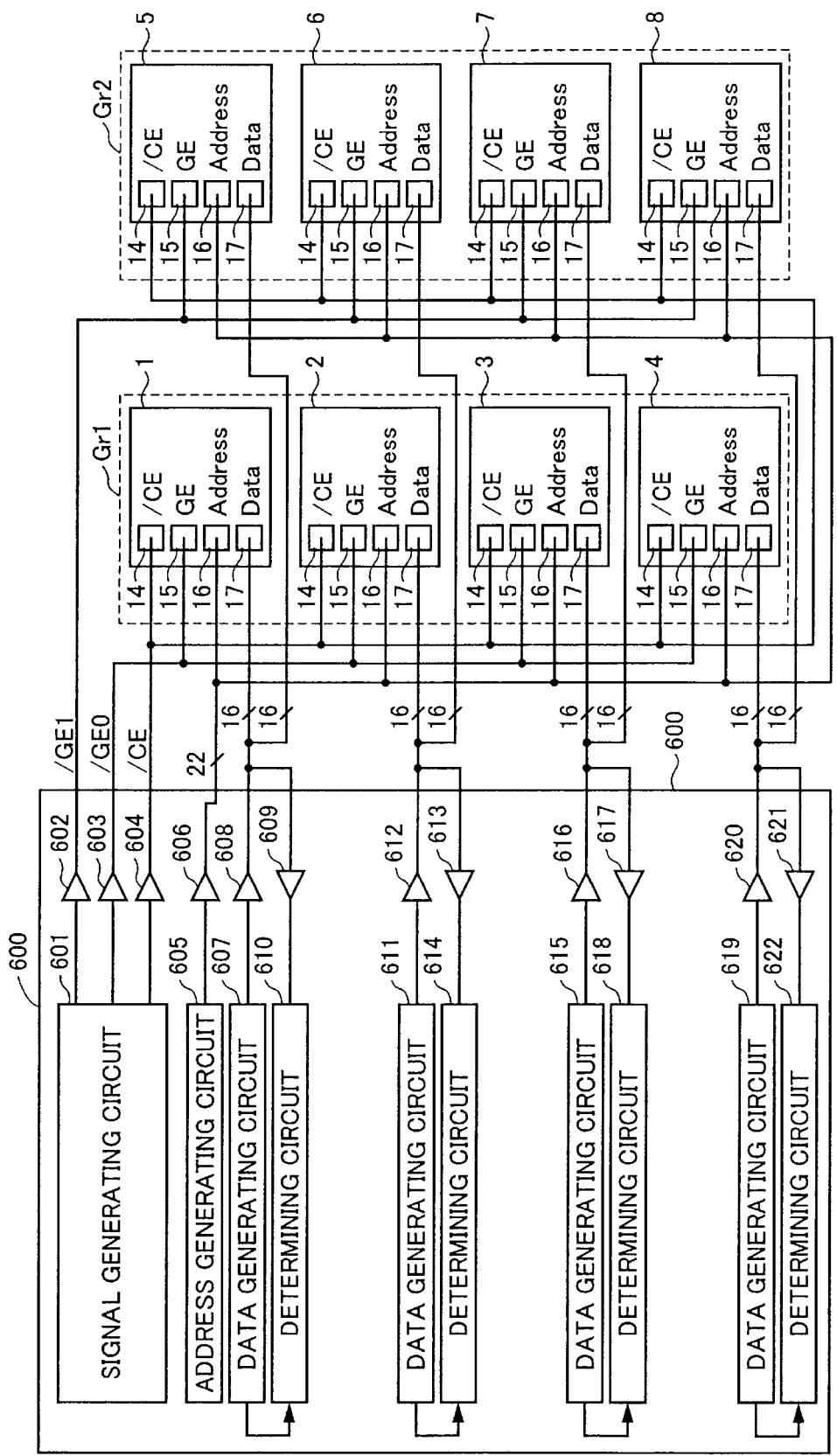
FIG. 3 is a diagram showing the connecting relation between the semiconductor memory device and a tester in the first embodiment.

Referring to FIG. 3, the connecting method between a tester and semiconductor memory devices at the time of the operation test in the first embodiment will be described. A tester 600 has a signal generating circuit 601, an address generating circuit 605, data generating circuits 607, 611, 615, and 619, determining circuits 610, 614, 618, and 622, drivers 602 to 604, 606, 608, 612, 616, and 620, and comparators 609, 613, 617, and 621.

The signal generating circuit 601 generates the chip enable signal /CE of the H or L level and the selection signals /GE0 and /GE1 of the H or L level. The driver 602 converts the selection signal /GE1 of the H or L level to a predetermined voltage value and outputs the voltage. The driver 603 converts the selection signal GE0 of the H or L level to a predetermined voltage value and outputs the voltage value. The driver 604 converts the chip enable signal /CE of the H or L level to a predetermined voltage value and outputs the voltage value.

The address generating circuit 605 generates an address. The driver 606 converts the address to a predetermined voltage value and outputs the voltage value. The data generating circuits 607, 611, 615, and 619 generate data "1" or "0". The drivers 608, 612, 616, and 620 converts data "1" or "0" from the data generating circuits 607, 611, 615, and 619 to a predetermined voltage value and outputs the voltage value. The comparator 609 compares the data read from semiconductor memory devices 1 and 5 with a predetermined level to convert it to data "1" or "0", and outputs the data "1" or "0" to the determining circuit 610. The comparator 613 compares data read from semiconductor memory devices 2 and 6 with a predetermined level to convert it to data "1" or "0", and outputs the data "1" or "0" to the determining circuit 614. The comparator 617 compares data read from semiconductor memory devices 3 and 7 with a predetermined level, converts it to data "1" or "0", and outputs the data "1" or "0" to the determining circuit 618. The comparator 621 compares data read from semiconductor memory devices 4 and 8 with a predetermined level to convert it to data "1" or "0", and outputs the data "1" or "0" to the determining circuit 622.

The determining circuit 610 compares the data "1" or "0" from the comparator 609 with the data "1" or "0" from the data generating circuit 607, and compares the read data from the semiconductor memory devices 1 and 5 with the write data. The determining circuit 614 compares the data "1" or "0" from the comparator 613 with the data "1" or "0" from the data generating circuit 611, and compares the data read from the semiconductor memory devices 2 and 6 with the write data. The determining circuit 618 compares the data "1" or "0" from the comparator 617 with the data "1" or "0" from the data generating circuit 615, and compares data read from the semiconductor memory devices 3 and 7 with the write data. The determining circuit 622 compares the data "1" or "0" from the comparator 621 with the data "1" or "0" from the data generating circuit 619 and compares data read from the semiconductor memory devices 4 and 8 with the write data.

Each of the semiconductor memory devices 1 to 8 has the same configuration as that of the semiconductor memory device 100 shown in FIG. 1 and has pads 14 to 17. Although it is shown in FIG. 3 that one pad 16 is provided for receiving an address and one pad 17 is provided to input and output data, each of the semiconductor memory devices 1 to 8 has 22 address pins A0 to A21 and 16 input/output pins DQ0 to DQ15 as shown in FIG. 1.

At the time of an operation test according to the first embodiment, the semiconductor memory devices 1 to 8 are connected to the tester 600 so that the selection signal GE0 is simultaneously supplied to the semiconductor memory devices 1 to 4, and the selection signal GE1 is supplied simultaneously to the semiconductor memory devices 5 to 8. The semiconductor memory devices 1 to 4 construct a group Gr1, and the semiconductor memory devices 5 to 8 construct a group Gr2. The driver 604 is connected to the semiconductor memory devices 1 to 8 so that the chip enable signal /CE can be simultaneously supplied to the semiconductor memory devices 1 to 8.

The driver 606 is connected to the semiconductor memory devices 1 to 8 so that an address is simultaneously supplied to the semiconductor memory devices 1 to 8. The driver 608 is connected to the semiconductor memory devices 1 and 5 so as to store data to the semiconductor memory devices 1 and 5. The driver 612 is connected to the semiconductor memory devices 2 and 6 so as to store data to the semiconductor memory devices 2 and 6. The driver 616 is connected to the semiconductor memory devices 3 and 7 so as to store data to the semiconductor memory devices 3 and 7. The driver 620 is connected to the semiconductor memory devices 4 and 8 so as to enter data to the semiconductor memory devices 4 and 8.

Figure 4:
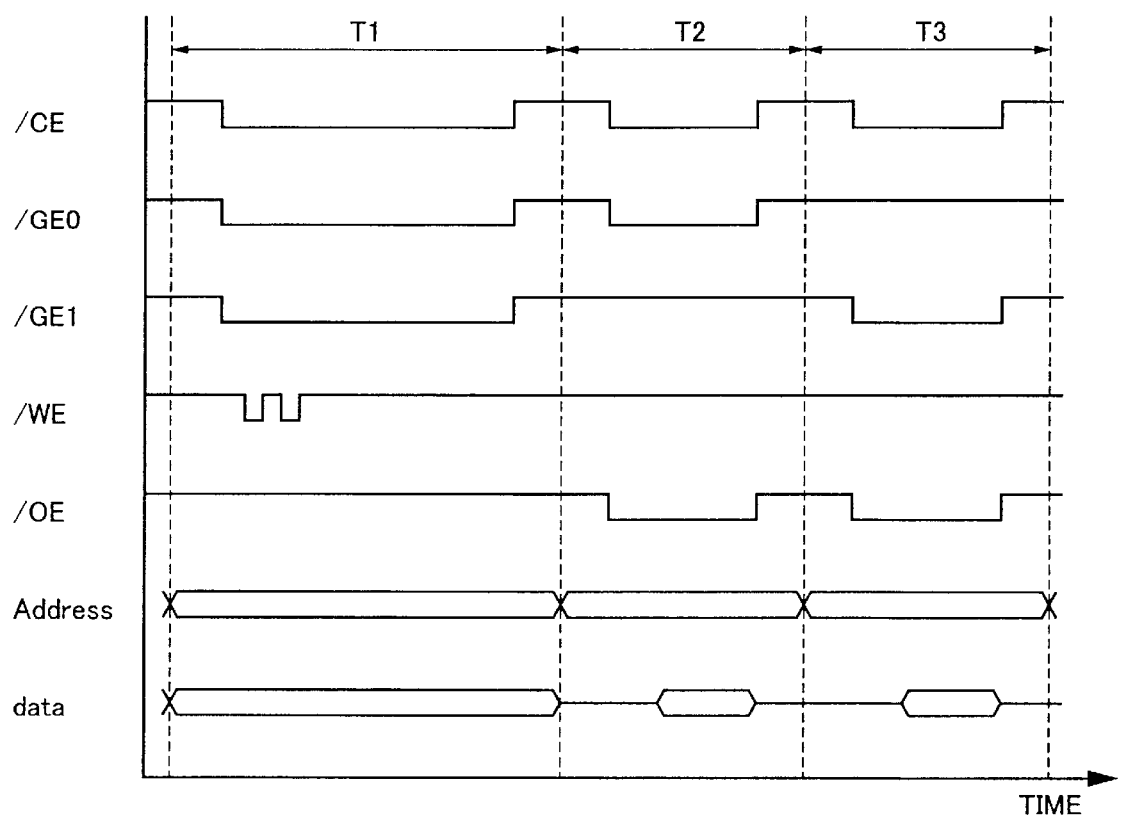
FIG. 4 is a timing chart of signals at the time of an operation test in the first embodiment.

Referring to FIGS. 3 and 4, the operations of the tester 600 and the semiconductor memory devices 1 to 8 at the time of the operation test in the first embodiment will now be described. The operation of writing data to the semiconductor memory devices 1 to 8 is performed in a period T1 shown in FIG. 4. In this case, the signal generating circuit 601 in the tester 600 generates the chip enable signal /CE of the L level, the selection signal GE0 of the L level, and the selection signal GE1 of the L level. The driver 602 converts the selection signal GE1 of the L level to a predetermined voltage value and outputs the voltage value to the pad 15 of each of the semiconductor memory devices 5 to 8 constructing the group GR2. The driver 603 converts the selection signal GE0 of the L level to a predetermined voltage value and outputs the voltage value to the pad 15 of each of the semiconductor memory devices 1 to 4 constructing the group Gr1. Further, the driver 604 converts the chip enable signal /CE of the L level to a predetermined voltage value and outputs the voltage value to the pad 14 in each of the semiconductor memory devices 1 to 8.

In such a manner, the chip enable signal /CE of the L level and the selection signal GE0 of the L level are supplied to the semiconductor memory devices 1 to 4, and the semiconductor memory devices 1 to 4 are activated by the above-described method. The chip enable signal /CE of the L level and the selection signal GE1 of the L level are also supplied to the semiconductor memory devices 5 to 8, and the semiconductor memory device 5 to 8 are activated by the above-described method.

After that, a signal generating circuit (not shown) of the tester 600 generates the write enable signal /WE, and a driver (not shown) converts the write enable signal /WE to a predetermined voltage value and outputs the voltage value to the pads (not shown) in the semiconductor memory devices 1 to 8. By the signal, the semiconductor memory devices 1 to 8 enter a data writable state as described above. The address generating circuit 605 generates an address, and the driver 606 converts the address to a predetermined voltage value and outputs the voltage value to the pad 16 in each of the semiconductor memory devices 1 to 8. The semiconductor memory devices 1 to 8 selectively make the word lines W1 to Wn and the bit line pairs BL1 and /BL1 to BLm and /BLm active in accordance with the address, thereby making the memory cell disposed in the position where the designated word line and bit line pair cross each other enter a data writable state.

After that, the data generating circuits 607, 611, 615, and 619 generate write data. The driver 608 converts the data generated by the data generating circuit 607 to a predetermined voltage value and outputs it to the pad 17 of each of the semiconductor memory devices 1 and 5. The driver 612 converts the data generated by the data generating circuit 611 to a predetermined voltage value and outputs it to the pad 17 of each of the semiconductor memory devices 2 and 6. The driver 616 converts the data generated by the data generating circuit 615 to a predetermined voltage value and outputs it to the pad 17 of each of the semiconductor memory devices 3 and 7. The driver 620 converts the data generated by the data generating circuit 619 to a predetermined voltage value and outputs it to the pad 17 of each of the semiconductor memory devices 4 and 8. Data is written to the memory cell MC which is activated in each of the semiconductor memory devices 1 to 8.

After that, the address generating circuit 605 sequentially generates different addresses and the semiconductor memory devices 1 to 8 receive the different addresses. The memory cells MC included in the semiconductor memory devices 1 to 8 are sequentially activated and data is written to the activated memory cells MC.

As described above, in the operation of writing data in the operation test, the tester 600 writes data simultaneously to the semiconductor memory devices 1 to 8 to be tested.

The operation of reading data from the semiconductor memory devices 1 to 8 will now be described. The operation of reading data from the semiconductor memory devices 1 to 8 is performed in periods T2 and T3 shown in FIG. 4. The operation of reading data from the semiconductor memory devices 1 to 4 constructing the group Gr1 is performed in the period T2, and the operation of reading data from the semiconductor memory devices 5 to 8 constructing the group Gr2 is performed in the. period T3.

At the time of reading data from the semiconductor memory devices 1 to 4, the signal generating circuit 601 generates the chip enable signal /CE of the L level, the selection signal /GE0 of the L level, and the selection signal /GE1 of the H level. The driver 602 converts the selection signal /GE1 of the H level to a predetermined voltage value and outputs the voltage value to the pads 15 in the semiconductor memory devices 5 to 8 constructing the group Gr2. The driver 603 converts the selection signal /GE0 of the L level to a predetermined voltage value and outputs it to the pads 15 in the semiconductor memory devices 1 to 4 constructing the group Gr1. Further, the driver 604 converts the chip enable signal /CE of the L level to a predetermined voltage value and outputs it to the pads 14 in the semiconductor memory devices 1 to 8.

The semiconductor memory devices 1 to 4 are activated by the chip enable signal /CE of the L level and the selection signal /GE0 of the L level. The semiconductor memory devices 5 to 8 are inactivated by the chip enable signal /CE of the L level and the selection signal GE1 of the H level. The signal generating circuit (not shown) in the tester 600 generates the output enable signal /OE of the L level, and the driver (not shown) converts the output enable signal /OE of the L level to a predetermined voltage value and outputs the resultant to the semiconductor memory devices 1 to 8 (since the semiconductor memory devices 5 to 8 are inactive, the output enable signal /OE outputted to the semiconductor memory devices 5 to 8 is not supplied to the inside of the semiconductor memory devices 5 to 8). The semiconductor memory devices 1 to 4 enter a data readable state as described above.

The address generating circuit 605 generates an address in a manner similar to the data writing operation. The driver 606 converts the address to a predetermined voltage value and outputs the resultant to the pads 16 of the semiconductor memory devices 1 to 8 (since the semiconductor memory devices 5 to 8 are inactive, addresses outputted to the semiconductor memory devices 5 to 8 are not supplied to the inside of the semiconductor memory devices 5 to 8). In the semiconductor memory devices 1 to 4, as described above, data is read from each of the memory cells MC. The data read from the memory cell MC included in the semiconductor memory device 1 is outputted to the comparator 609 via the pad 17, and the comparator 609 compares the data read from the semiconductor memory device 1 with a predetermined level, and outputs data "1" or "0" as a result of the comparison to the determining circuit 610. The determining circuit 610 compares the data "1" or "0" from the comparator 609 with the data "1" or "0" from the data generating circuit 607 to thereby determine whether the read data coincides with the write data or not.

The data read from the memory cell MC included in the semiconductor memory device 2 is outputted to the comparator 613 via the pad 17, and the comparator 613 compares the data read from the semiconductor memory device 2 with a predetermined level, and outputs data "1" or "0" as a result of the comparison to the determining circuit 614. The determining circuit 614 compares the data "1" or "0" from the comparator 613 with the data "1" or "0" from the data generating circuit 611 to thereby determine whether the read data coincides with the write data or not. The data read out from the memory cell MC included in the semiconductor memory device 3 is outputted via the pad 17 to the comparator 617, and the comparator 617 compares the data read from the semiconductor memory device 3 with a predetermined level, and outputs data "1" or "0" as a result of the comparison to the determining circuit 618. The determining circuit 618 compares the data "1" or "0" from the comparator 617 with the data "1" or "0" from the data generating circuit 615 to thereby determine whether the read data coincides with the write data or not. The data read out from the memory cell MC included in the semiconductor device 4 is outputted via the pad 17 to the comparator 621, and the comparator 621 compares the data read from the semiconductor memory device 4 with a predetermined level, and outputs data "1" or "0" as a result of the comparison to the determining circuit 622. The determining circuit 622 compares the data "1" or "0" from the comparator 621 with the data "1" or "0" from the data generating circuit 619 to thereby determine whether the read data coincides with the write data or not.

In such a manner, the data is read from the semiconductor memory devices 1 to 4 constructing the group Gr1. By comparing the read data with the write data, the operation test of the semiconductor memory devices 1 to 4 is conducted.

At the time of reading data from the semiconductor memory devices 5 to 8 constructing the group Gr2, the signal generating circuit 601 generates the chip enable signal /CE of the L level, the selection signal /GE0 of the H level, and the selection signal GE1 of the L level. The driver 602 converts the selection signal /GEl of the L level to a predetermined voltage value and outputs the voltage value. The driver 603 converts the selection signal /GE0 of the H level to a predetermined voltage value and outputs the voltage value. The driver 604 converts the chip enable signal /CE of the L level to a predetermined voltage value and outputs the voltage value.

The semiconductor memory devices 1 to 4 constructing the group Gr1 are inactivated by the chip enable signal /CE of the L level and the selection signal /GE0 of the H level. The semiconductor memory devices 5 to 8 constructing the group Gr2 are activated by the chip enable signal /CE of the L level and the selection signal /GE1 of the L level.

After that, data is read from the semiconductor memory devices 5 to 8 in a manner similar to the above. The read data is subjected to the determining operation of the determining circuits 610, 614, 618, and 622. In such a manner, the operation test on the semiconductor memory devices 5 to 8 is finished.

As described above, the semiconductor memory devices 1 to 8 are divided into the two groups Gr1 and Gr2. The operation test is carried out by simultaneously writing data to the semiconductor memory devices 1 to 8 and reading data from the semiconductor memory devices 1 to 4 constructing the group Gr1 and from the semiconductor memory device 5 to 8 constructing the group Gr2 by switching the level of each of the selection signals GE0 and GE1. Consequently, without increasing the number of test pins in the tester, semiconductor memory devices of the number larger as compared with a conventional technique can be tested. Particularly, since data can be simultaneously written to all of the semiconductor memory devices to be tested, the operation test time can be largely shortened in a flash memory which requires long time for data writing.

In the first embodiment, the selection signals generated by the tester are not limited to the two control signals GE0 and GE1 but three or more signals may be used.

The semiconductor memory device 100 which passes the operation test is shipped. Since the final semiconductor memory device 100 includes the activating/inactivating circuit 10, after setting one of the terminals of the NOR gate 11 to the L level via the pad 15, shipment is made. As a result, the activating/inactivating circuit 10 outputs the activation or inactivation signal to the input/output interface circuit 20 in response to the logic level of the chip enable signal /CE. The semiconductor memory device can be therefore activated or inactivated by the chip enable signal /CE in a manner similar to the conventional technique.

According to the first embodiment, since the semiconductor memory device 100 has the activating/inactivating circuit 10 as shown in FIG. 2, the semiconductor memory devices are divided into the groups Gr1 and Gr2 by switching the logic of the selection signal /GE. Consequently, a number of semiconductor memory devices can be simultaneously tested.

Second Embodiment

In a second embodiment, an operation test is conducted by using semiconductor memory devices of two types. One of the semiconductor memory devices has the same configuration as that of the semiconductor memory device 100 shown in FIG. 1 and the other semiconductor memory device is a semiconductor memory device 200 shown in FIG. 5.

Figure 5:
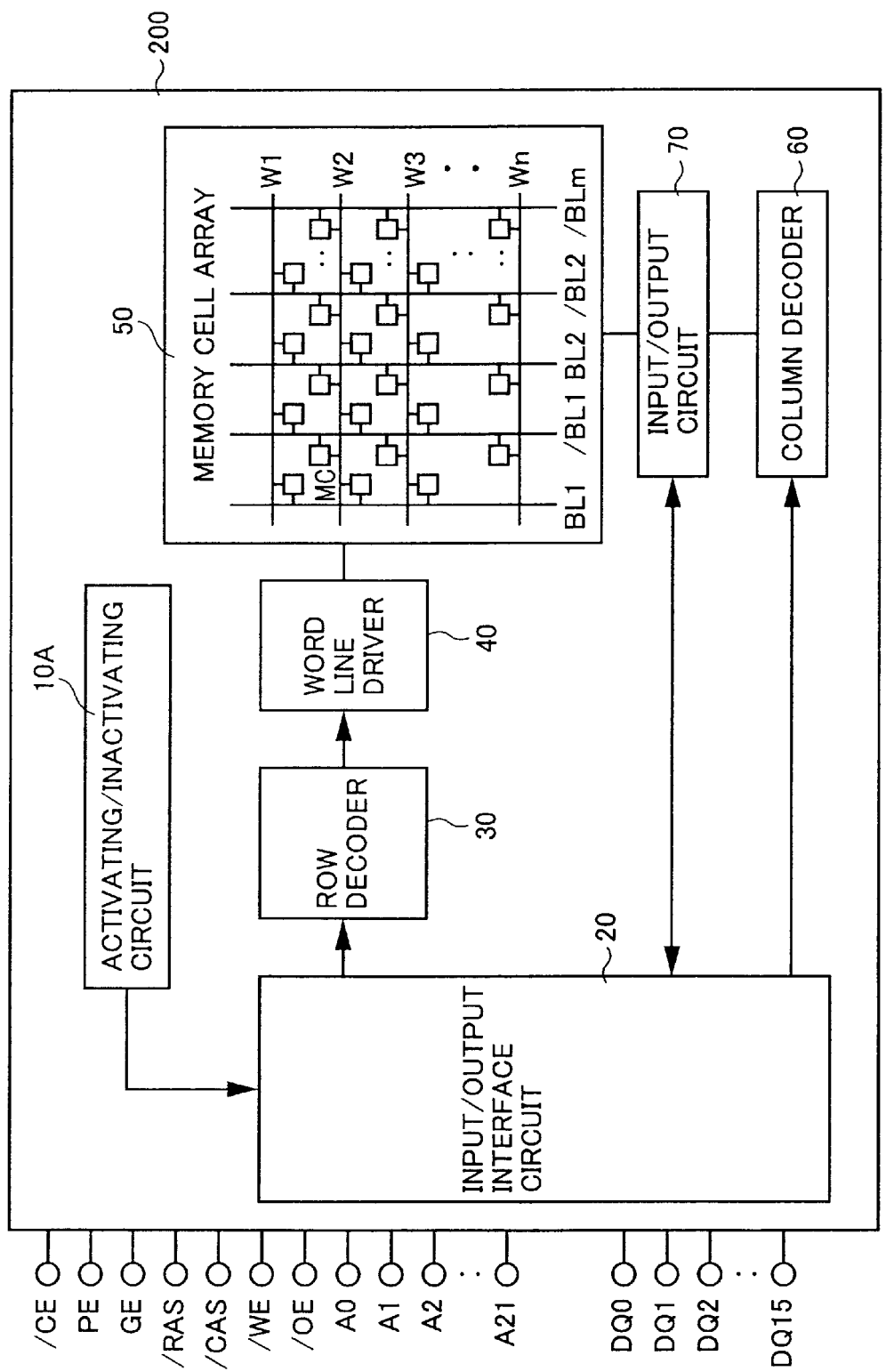
FIG. 5 is a schematic block diagram showing the configuration of a semiconductor memory device according to a second embodiment of the invention.

Referring to FIG. 5, the semiconductor memory device 200 is similar to the semiconductor memory device 100 except that an activating/inactivating circuit 10A is used in place of the activating/inactivating circuit 10, and the chip enable signal /CE, the selection signal GE, and a control signal PE are supplied to the activating/inactivating circuit 10A.

Figure 6:
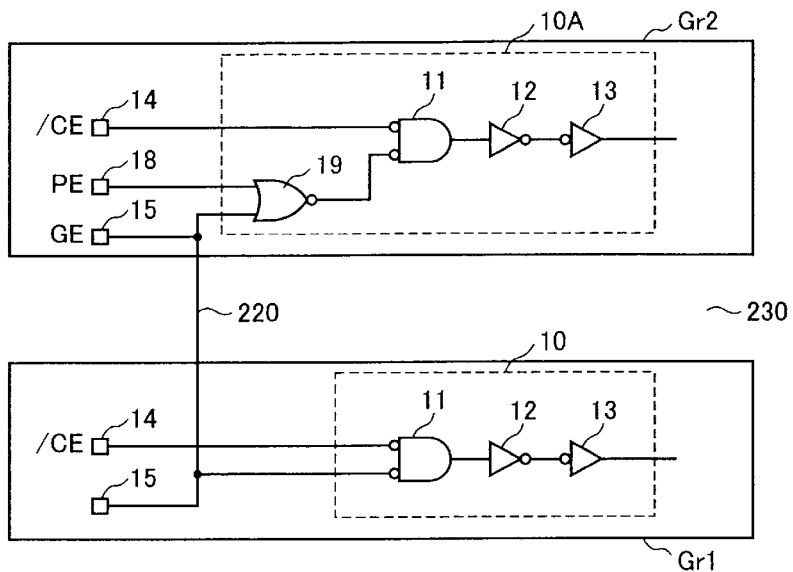
FIG. 6 is a circuit diagram showing the activating/ inactivating circuit of the semiconductor memory device illustrated in FIGS. 1 and 5.

Referring to FIG. 6, the activating/inactivating circuit 10A has NOR gates 11 and 19 and inverters 12 and 13. The NOR gate 11 receives the chip enable signal /CE from one of the terminals via the pad 14, and receives the output signal of the NOR gate 19 from the other terminal. The NOR gate 19 receives the selection signal GE from one of the terminals via the pad 15 and receives the control signal PE from the other terminal via the pad 18.

When the chip enable signal /CE of the L level and the control signal PE of the H level are supplied to the activating/inactivating circuit 10A, the activating/inactivating circuit 10A outputs a H level signal, namely, an activation signal. That is, when the control signal PE is H level, irrespective of the level of the selection signal GE, the NOR gate 19 outputs an L level signal. On the basis of the chip enable signal /CE of the L level and the L level signal from the NOR gate 19, the NOR gate 11 outputs a signal of the H level. Since the inverters 12 and 13 invert the input signal, the activating/inactivating circuit 10A outputs an H level signal.

When the chip enable signal /CE of the L level, the control signal PE of the L level, and the selection signal GE of the L level are entered, the activating/inactivating circuit 10A outputs an L level signal, that is, an inactivation signal. Specifically, on the basis of the control signal PE of the L level and the selection signal GE of the L level, the NOR gate 19 outputs an H level signal. On the basis of the chip enable signal /CE of the L level and the H level signal from the NOR gate 19, the NOR gate 11 outputs an L level signal. Since the inverters 12 and 13 invert the input signal, the activating/inactivating circuit 10A outputs an L level signal.

Consequently, the activating/inactivating circuit 10A outputs the activation or inactivation signal on the basis of the chip enable signal /CE, control signal PE, and selection signal GE.

In the second embodiment, the semiconductor memory device 100 having the activating/inactivating circuit 10 is disposed in the group Gr1, and the semiconductor memory device 200 having the activating/inactivating circuit 10A is disposed in the group Gr2. The pad 15 in the semiconductor memory device 200 and the pad 15 in the semiconductor memory device 100 are connected by an interconnection 220 via an area 230 in which no semiconductor memory device is formed.

In the tester 600, by outputting the chip enable signal /CE, selection signal GE, and control signal PE to the semiconductor memory device 200 and outputting the chip enable signal /CE to the semiconductor memory device 100, the group Gr1 and the group Gr2 can be selectively switched. Data from the semiconductor memory devices included in the groups can be simultaneously read.

Figure 7:
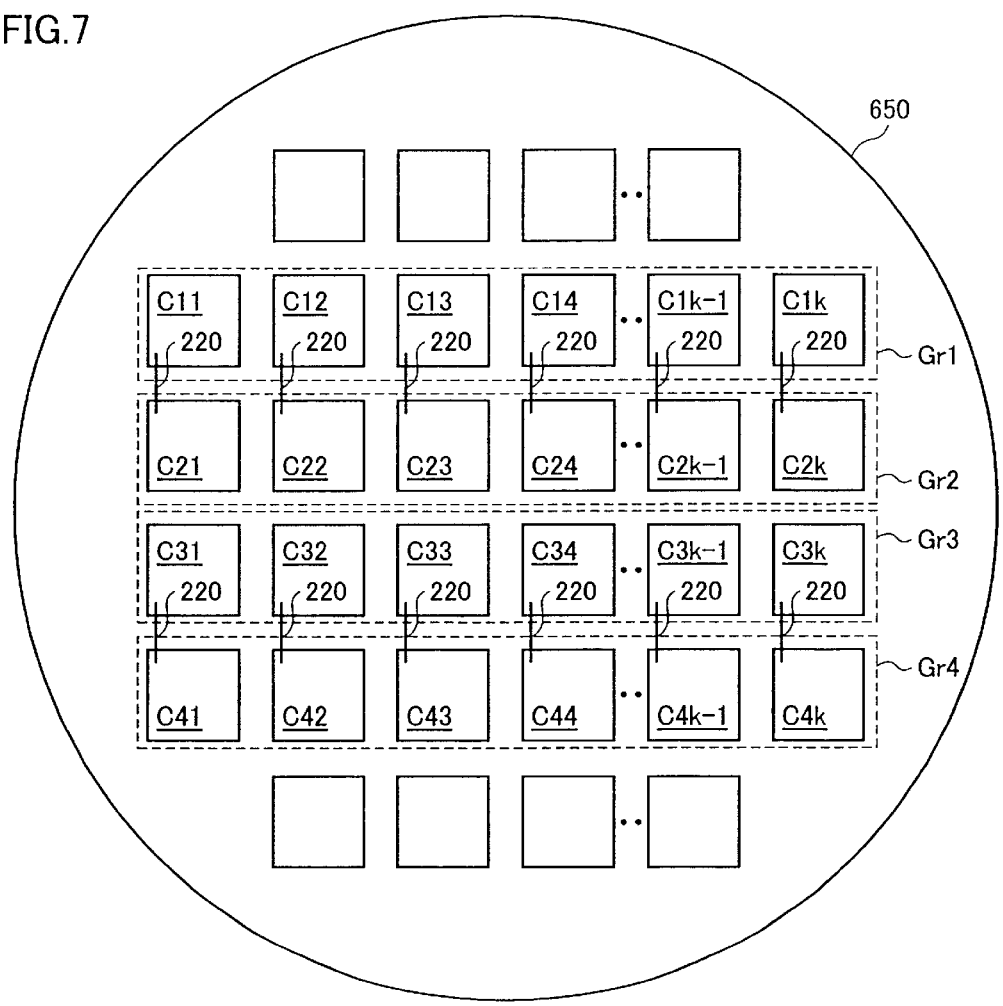
FIG. 7 is a plan view schematically showing a semiconductor wafer on which a plurality of semiconductor memory devices are fabricated.

Referring to FIG. 7, on completion of the wafer process, semiconductor memory devices C11 to C1k, C21 to C2k, C31 to C3k, C41 to C4k . . . are formed in a grid pattern on the semiconductor wafer 650. The semiconductor memory devices C11 to C1k are defined as a group Gr1, the semiconductor memory devices C21 to C2k are defined as a group Gr2, the semiconductor memory devices C31 to C3k are defined as a group Gr3, and the semiconductor memory devices C41 to C4k are defined as a group Gr4 (k is a natural number). The semiconductor memory devices C11 to C1k included in the group Gr1 are connected to the semiconductor memory devices C21 to C2k included in the group Gr2 via the interconnections 220, respectively. The semiconductor memory devices C31 to C3k included in the group Gr3 are connected to the semiconductor memory devices C41 to C4k included in the group Gr4 via the interconnections 220, respectively. Generally, (k) pieces of semiconductor memory devices arranged in the row direction included the (2n−1)th group (n is a natural number) are connected to (k) pieces of semiconductor memory devices arranged in the row direction included in the 2n-th group to each other via the interconnections 220.

Each of the (k) semiconductor memory devices included in the (2n−1)th group takes the form of the semiconductor memory device 100 shown in FIG. 1. Each of the (k) semiconductor memory devices included in the 2n-th group takes the form of the semiconductor memory device 200 shown in FIG. 5. The tester 600 outputs the chip enable signal /CE, selection signal GE, and control signal PE to each of the (k) semiconductor memory devices included in the 2n-th group, and outputs the chip enable signal /CE to each of the (k) semiconductor memory devices included in the (2n−1)th group. The operation test in the second embodiment is, therefore, an operation test conducted immediately after the wafer process.

Figure 8:
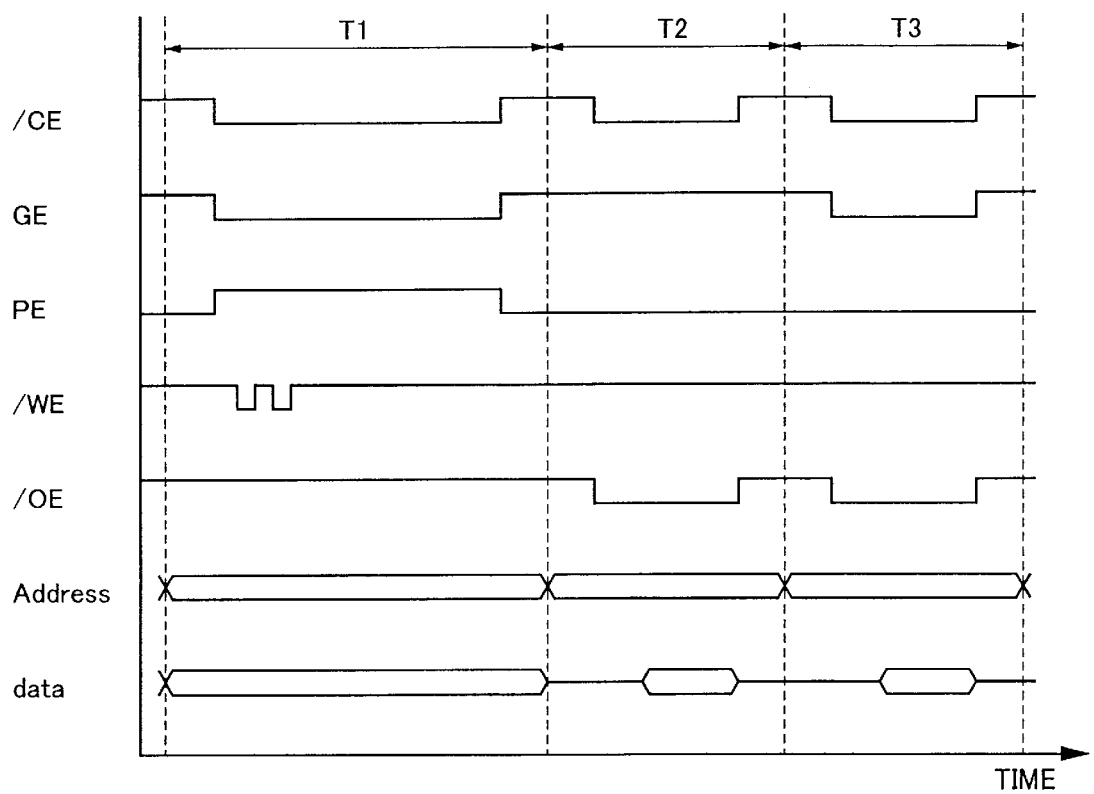
FIG. 8 is a timing chart of signals at the time of an operation test according to a second embodiment.

Referring to FIGS. 6 to 8, the test operation in the second embodiment will be described. Data is written to all the semiconductor memory devices formed on the semiconductor wafer 650 in the period T1 shown in FIG. 8. In this case, the tester 600 outputs the chip enable signal /CE of the L level, the selection signal GE of the L level, and the control signal PE of the H level to a plurality of semiconductor memory devices included in the 2n-th group, and outputs the chip enable signal /CE of the L level to a plurality of semiconductor memory devices included in the (2n−1)th group.

The activating/inactivating circuit 10A in the semiconductor memory device 200 included in the 2n-th group outputs an activation signal on the basis of the chip enable signal /CE of the L level, the selection signal GE of the L level, and the control signal PE of the H level. The activating/inactivating circuit 10 in the semiconductor memory device 100 included in the (2n−1)th group outputs an activation signal on the basis of the chip enable signal /CE of the L level and the selection signal GE of the L level. Consequently, the plurality of semiconductor memory devices included in the (2n−1)th group and the semiconductor memory devices included in the 2n-th group are simultaneously activated. After that, in a manner similar to the method described in the first embodiment, data is written to the plurality of semiconductor memory devices included in each of the groups.

The operation of reading data from the plurality of semiconductor memory devices included in each group will be described. In the period T2 shown in FIG. 8, data is read from the plurality of semiconductor memory devices included in the 2n-th group. In this case, the tester 600 outputs the chip enable signal /CE of the L level, the selection signal GE of the H level, and the control signal PE of the L level.

The activating/inactivating circuit 10A in the semiconductor memory device 200 included in the 2n-th group outputs an activation signal on the basis of the chip enable signal /CE of the L level, the selection signal GE of the H level, and the control signal PE of the L level. The activating/inactivating circuit 10 of the semiconductor memory device 100 included in the (2n−1)th group outputs an inactivation signal on the basis of the chip enable signal /CE of the L level and the selection signal GE of the H level. The plurality of semiconductor memory devices included in the 2n-th group are activated and the plurality of semiconductor memory devices included in the (2n−1)th group are inactivated. After that, in a manner similar to the first embodiment, data is read from the plurality of semiconductor memory devices included in the 2n-th group and the read data is compared with the write data. In such a manner, the operation test on the plurality of semiconductor memory devices included in the 2n-th group is carried out.

The operation of reading data from the plurality of semiconductor memory devices included in the (2n−1)th group is performed in the period T3 shown in FIG. 8. In this case, the tester 600 outputs the chip enable signal /CE of the L level, the selection signal GE of the L level, and the control signal PE of the L level.

The activating/inactivating circuit 10A in the semiconductor memory device 200 included in the 2n-th group outputs inactivation signals on the basis of the chip enable signal /CE of the L level, the selection signal GE of the L level, and the control signal PE of the L level. The activating/inactivating circuit 10 in the semiconductor memory device 100 included in the (2n−1)th group outputs an activation signal on the basis of the chip enable signal /CE of the L level and the selection signal GE of the L level. The plurality of semiconductor memory devices included in the (2n−1)th group are activated and the plurality of semiconductor memory devices included in the 2n-th group are inactivated. After that, in a manner similar to the first embodiment, data is read from the plurality of semiconductor memory devices included in the (2n−1)th group, and the read data is compared with the write data, thereby conducting the operation test on the plurality of semiconductor memory devices included in the (2n−1) the group.

After completing the operation tests on a set of the (2n−1)th group and the 2n-th group, operation tests are carried out on the next set of the (2n−1)th group and the 2n-th group. By conducting the operation test every set of the (2n−1)th group and the 2n-th group, all of the semiconductor memory devices fabricated on the semiconductor wafer 650 are subjected to the operation test.

The semiconductor memory devices 100 which have passed the operation test immediately after the wafer process are separated from each other by cutting the semiconductor wafer. After the semiconductor memory device 100 are packaged, an operation test is carried out again, and the satisfactory semiconductor memory device 100 is shipped. Since the final semiconductor memory device 100 includes the activating/inactivating circuit 10, one of the terminals of the NOR gate 11 is set to the L level via the pad 15, and shipment is made. As a result, the activating/inactivating circuit 10 outputs an activation or inactivation signal to the input/output interface circuit 20 in response to the logical level of the chip enable signal /CE. Consequently, in a manner similar to the conventional technique, the semiconductor memory device can be activated or inactivated by the chip enable signal /CE.

The semiconductor memory devices 200 which have passed the operation test immediately after the wafer process are separated from each other by cutting the semiconductor wafer. After the semiconductor memory device 200 is packaged, an operation test is carried out again, and the satisfactory semiconductor memory device 200 is shipped. Since the final semiconductor memory device 200 includes the activating/inactivating circuit 10A, signals are supplied from the pads 15 and 18 so that one of the terminals of the NOR gate 11 is set to the L level, and shipment is made. As a result, the activating/inactivating circuit 10A outputs an activation or inactivation signal to the input/output interface circuit 20 in response to the logical level of the chip enable signal /CE. Consequently, in a manner similar to the conventional technique, the semiconductor memory device can be activated or inactivated by the chip enable signal /CE.

According to the second embodiment, the two kinds of semiconductor memory devices are fabricated in the two groups. Data is written to all of the semiconductor memory devices irrespective of the kinds of the semiconductor memory devices, and the data is read from the semiconductor memory devices on the group unit basis. Thus, the operation test time immediately after the wafer process can be largely shortened. Particularly, the operation test of the flash memory requiring long time to write data can be efficiently conducted.

The control signal for selectively activating the two kinds of semiconductor memory devices is shared by the two kinds of semiconductor memory devices. Consequently, by applying the shared control signal to the semiconductor memory device in one of the groups, the two kinds of semiconductor memory devices can be selectively activated.

Third Embodiment

Figure 9:
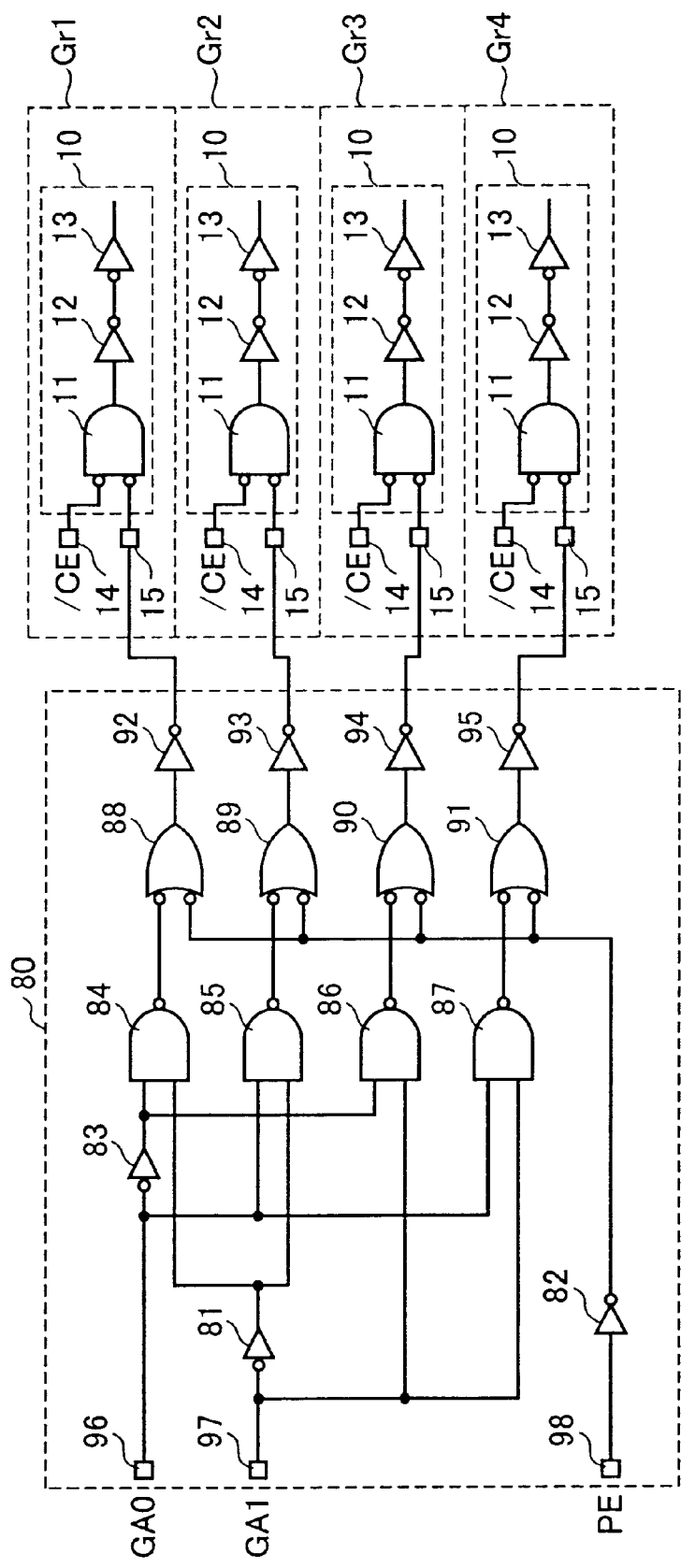
FIG. 9 is a circuit diagram of a circuit fabricated on a semiconductor wafer according to a third embodiment of the invention.

Referring to FIG. 9, an operation test according to a third embodiment is conducted on a plurality of semiconductor memory devices fabricated on a semiconductor wafer, which are divided into four groups Gr1 to Gr4. Each of the semiconductor memory devices included in the groups Gr1 to Gr4 has the same configuration as that of the semiconductor memory device 100 shown in FIG. 1, and includes the activating/inactivating circuit 10 and the pads 14 and 15.

In the area 230 where no semiconductor memory device is fabricated on the semiconductor wafer, a decoding circuit 80 is fabricated. The decoding circuit 80 has inverters 81 to 83 and 92 to 95, NAND gates 84 to 87, NOR gates 88 to 91, and pads 96 to 98. The pad 96 receives the selection signal GA0, the pad 97 receives the selection signal GA1, and the pad 98 receives the control signal PE. The control signal PE supplied from the pad 98 is inverted by the inverter 82, and the resultant is supplied to one of the terminals of each of the NOR gates 88 to 91. When the control signal PE of the H level is supplied to the decoding circuit 80, an L level signal is supplied to the one of the terminals of each of the NOR gates 88 to 91. Irrespective of the level of an output signal of each of the NAND gates 84 to 87 supplied to the other terminal, the NOR gates 88 to 91 output H level signals, and the inverters 92 to 95 output L level signals accordingly.

The activating/inactivating circuit 10 in the semiconductor memory device 100 included in each of the groups Gr1 to Gr4 receives an L level signal from the pad 15. When the chip enable signal /CE of the L level is received from the pad 14, the activating/inactivating circuit 10 outputs an H level signal as described above, thereby activating the semiconductor memory device 100.

By supplying the control signal PE of the H level to the decoding circuit 80 and supplying the chip enable signal /CE of the L level to the semiconductor memory device 100 included in each of the groups Gr1 to Gr4, all of the semiconductor memory devices included in the groups Gr1 to Gr4 can be activated.

When the selection signals GA0 and GA1 of the L level and the control signal PE of the L level are supplied, the decoding circuit 80 outputs an L level signal from the inverter 92 and outputs an H level signal from each of the inverters 93 to 95. As a result, the semiconductor memory devices included in the group Gr1 are activated, and the semiconductor memory devices included in the groups Gr2 to Gr4 are inactivated.

When the selection signal GA0 of the H level, the selection signal GA1 of the L level, and the control signal PE of the L level are supplied, the decoding circuit 80 outputs an L level signal from the inverter 93 and outputs an H level signal from each of the inverters 92, 94 and 95. As a result, the semiconductor memory devices included in the group Gr2 are activated, and the semiconductor memory devices included in the groups Gr1, Gr3, and Gr4 are inactivated.

Further, when the selection signal GA0 of the L level, the selection signal GA1 of the H level, and the control signal PE of the L level are supplied, the decoding circuit 80 outputs an L level signal from the inverter 94 and outputs an H level signal from each of the inverters 92, 93 and 95. As a result, the semiconductor memory devices included in the group Gr3 are activated, and the semiconductor memory devices included in the groups Gr1, Gr2, and Gr4 are inactivated.

Further, when the selection signal GA0 of the H level, the selection signal GA1 of the H level, and the control signal PE of the L level are supplied, the decoding circuit 80 outputs an L level signal from the inverter 95 and outputs an H level signal from each of the inverters 92 to 94. As a result, the semiconductor memory devices included in the group Gr4 are activated, and the semiconductor memory devices included in the groups Gr1 to Gr4 are inactivated.

As described above, by switching the logic level of each of the selection signals GA0 and GA1 and the control signal PE, the semiconductor memory devices included in the groups Gr1 to Gr4 are selectively activated on the group unit basis.

Although FIG. 9 shows that one semiconductor memory device is included in each of the groups Gr1 to Gr4, in practice, a plurality of semiconductor memory devices are included in each of the groups Gr1 to Gr4. Therefore, each of the inverters 92 to 95 in the decoding circuit 80 outputs the signal of the L or H level to the pads 15 of the plurality of semiconductor memory devices.

Figure 10:
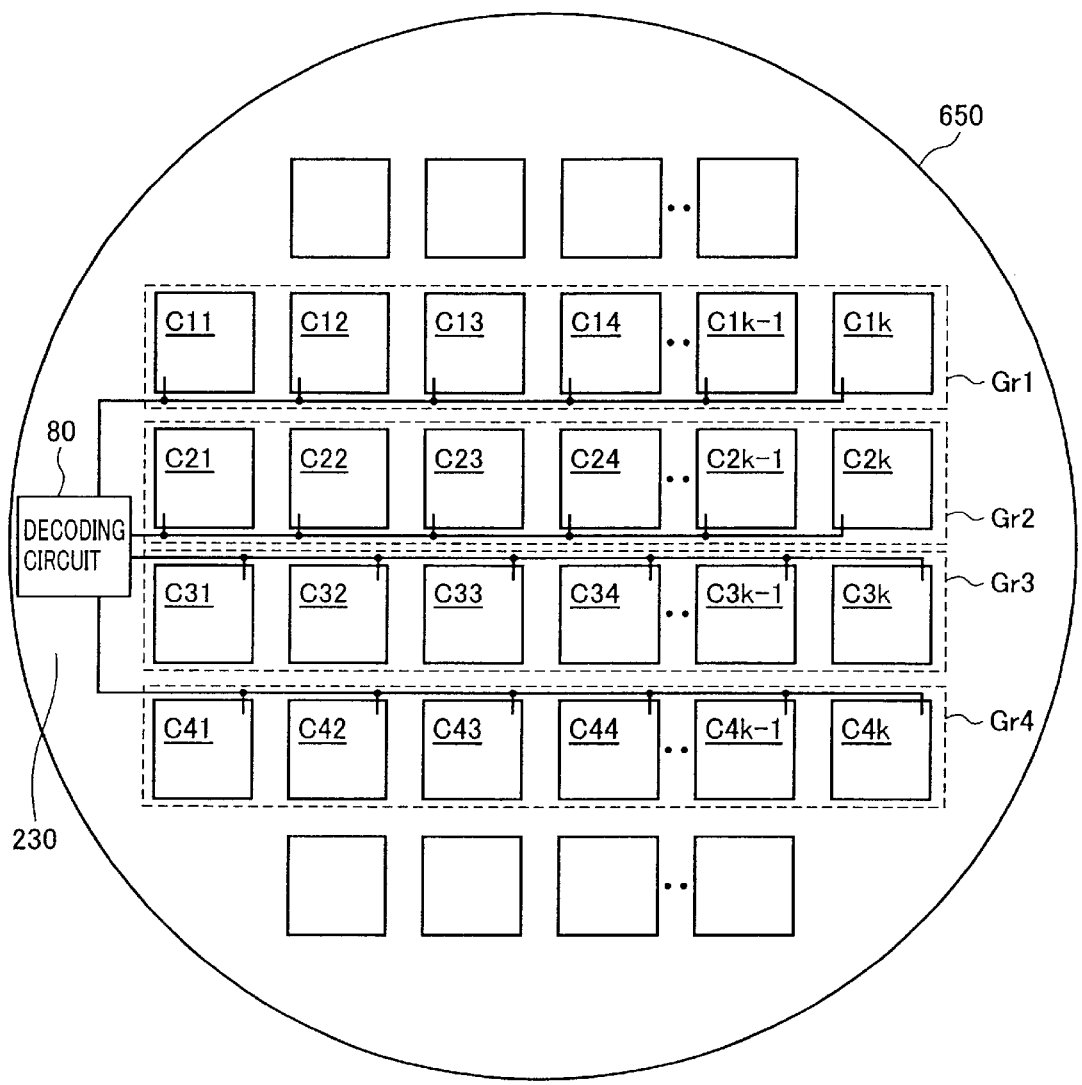
FIG. 10 is a plan view schematically showing a semiconductor wafer on which a plurality of semiconductor memory devices and a circuit used for an operation test are fabricated.

Referring to FIG. 10, on a semiconductor wafer 650, a plurality of semiconductor memory devices C11 to C1k, C21 to C2k, C31 to C3k, and C41 to C4k are fabricated in a grid pattern. Each of the plurality of semiconductor memory devices C11 to C1k, C21 to C2k, C31 to C3k, and C41 to C4k has the same configuration as that of the semiconductor memory device 100 shown in FIG. 1. The plurality of semiconductor memory devices C11 to C1k construct the group Gr1, the semiconductor memory devices C21 to C2k construct the group G2, the semiconductor memory devices C31 to C3k construct the group Gr3, and the semiconductor memory devices C41 to C4k construct the group Gr4. A decoding circuit 80 is fabricated in the area 230 where no semiconductor memory device is fabricated on the semiconductor wafer 650. The decoding circuit 80 is connected to the plurality of semiconductor memory devices C11 to C1k, C21 to C2k, C31 to C3k, and C41 to C4k included in the groups Gr1 to Gr4. In this case, the inverter 92 in the decoding circuit 80 is connected to the semiconductor memory devices C11 to C1k included in the group Gr1, the inverter 93 is connected to the semiconductor memory devices C21 to C2k included in the group Gr2, the inverter 94 is connected to the semiconductor memory devices C31 to C3k included in the group Gr3, and the inverter 95 is connected to the semiconductor memory devices C41 to C4k included in the group Gr4.

Figure 11:
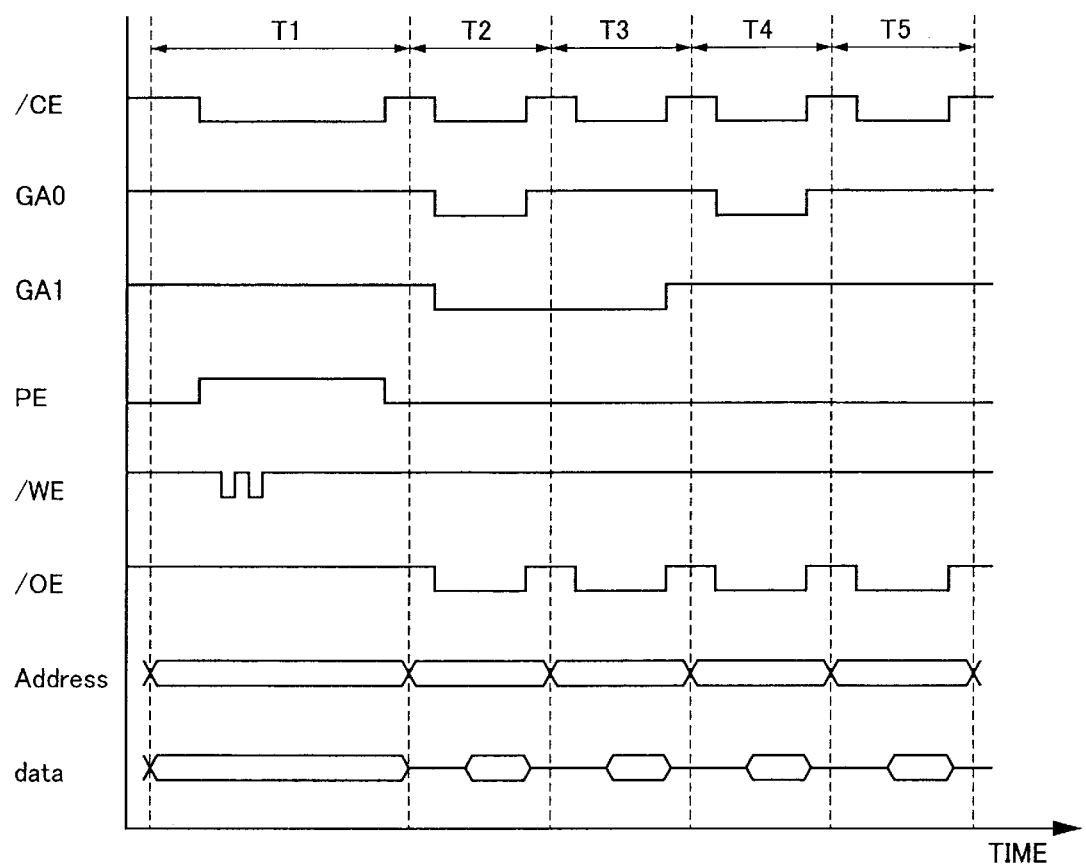
FIG. 11 is a timing chart of signals at the time of an operation test in the third embodiment.

Referring to FIGS. 9 to 11, the method of carrying out the operation test on the semiconductor memory device according to the third embodiment will be described. In the period T1 shown in FIG. 11, data is simultaneously written to the semiconductor memory devices C11 to C1k, C21 to C2k, C31 to C3k, and C41 to C4k fabricated on the semiconductor wafer 650. That is, data is written to all of the semiconductor memory devices included in the groups Gr1 to Gr4.

In the period T2, the data is read from the semiconductor memory devices C11 to C1k included in the group Gr1. In the period T3, the data is read from the semiconductor memory devices C21 to C2k included in the group Gr2. In the period T4, the data is read from the semiconductor memory devices C31 to C3k included in the group Gr3. In the period T5, the data is read from the semiconductor memory devices C41 to C4k included in the group Gr4.

In the period T1, when data is written to all of the semiconductor memory devices C11 to C1k, C21 to C2k, C31 to C3k, and C41 to C4k included in the groups Gr1 to Gr4, the tester 600 outputs the chip enable signal /CE of the L level to the semiconductor memory devices in the groups Gr1 to Gr4, and outputs the selection signals GA0 and GA1 of the H level and the control signal PE of the H level to the decoding circuit 80.

On the basis of the control signal PE of the H level, the decoding circuit 80 outputs an L level signal from each of the inverters 92 to 95 to each of the semiconductor memory devices C11 to C1k, C21 to C2k, C31 to C3k, and C41 to C4k included in the groups Gr1 to Gr4. As a result, the semiconductor memory devices C11 to C1k, C21 to C2k, C31 to C3k, and C41 to C4k are activated.

After that, the tester 600 outputs the write enable signal /WE to the semiconductor memory devices C11 to C1k, C21 to C2k, C31 to C3k, and C41 to C4k. The semiconductor memory devices C11 to C1k, C21 to C2k, C31 to C3k, and C41 to C4k enter a data writable state on the basis of the write enable signal /WE. The tester 600 outputs an address to the. semiconductor memory devices C11 to C1k, C21 to C2k, C31 to C3k, and C41 to C4k and data is written to each of the semiconductor memory devices C11 to C1k, C21 to C2k, C31 to C3k, and C41 to C4k. The tester 600 sequentially outputs different addresses to the semiconductor memory devices C11 to C1k, C21 to C2k, C31 to C3k, and C41 to C4k. The data is written into the memory cells included in the semiconductor memory devices C11 to C1k, C21 to C2k, C31 to C3k, and C41 to C4k. In such a manner, data can be written simultaneously to the semiconductor memory devices C11 to C1k, C21 to C2k, C31 to C3k, and C41 to C4k included in the groups Gr1 to Gr4.

After completion of writing of data, the data is read from the semiconductor memory devices C11 to C1k included in the group Gr1 in the period T2 shown in FIG. 11. In this case, the tester 600 outputs the chip enable signal /CE of the L level to the semiconductor memory devices C11 to C1k, C21 to C2k, C31 to C3k, and C41 to C4k included in the groups Gr1 to Gr4, and outputs the selection signals GA0 and GA1 of the L level and the control signal PE of the L level to the decoding circuit 80.

The decoding circuit 80 outputs an L level signal to the semiconductor memory devices C11 to C1k included in the group Gr1, and outputs an H level signal to the semiconductor memory devices C21 to C2k, C31 to C3k, and C41 to C4k included in the groups Gr2 to Gr4, respectively. As a result, the semiconductor memory devices C11 to C1k included in the group Gr1 are activated, and the semiconductor memory devices C21 to C2k, C31 to C3k, and C41 to C4k included in the groups Gr2 to Gr4 are inactivated. After that, the tester 600 outputs the output enable signal /OE to the semiconductor memory devices C11 to C1k, C21 to C2k, C31 to C3k, and C41 to C4k, and data can be read from the semiconductor memory devices C11 to C1k which are activated. An address is outputted from the tester 600 to the semiconductor memory devices C11 to C1k, C21 to C2k, C31 to C3k, and C41 to C4k, and data is read from the semiconductor memory devices C11 to C1k which are activated. After that, it is determined by the above-described method whether the read data coincides with the write data or not, and the reading test of the semiconductor memory devices C11 to C1k included in the group Gr1 is finished.

In the period T3 shown in FIG. 11, data is read from the semiconductor memory devices C21 to C2k included in the group Gr2. In this case, the tester 60 outputs the chip enable signal /CE of the L level to the semiconductor memory devices C11 to C1k, C21 to C2k, C31 to C3k, and C41 to C4k included in the groups Gr1 to Gr4, and outputs the selection signal GA0 of the H level, the selection signal GA1 of the L level, and the control signal PE of the L level to the decoding circuit 80.

The decoding circuit 80 outputs an L level signal to the semiconductor memory devices C21 to C2k included in the group Gr2, and outputs an H level signal to the semiconductor memory devices C11 to C1k, C31 to C3k, and C41 to C4k included in the groups Gr1, Gr3, and Gr4. As a result, the semiconductor memory devices C21 to C2k included in the group Gr2 are activated, and the semiconductor memory devices C11 to C1k, C31 to C3k, and C41 to C4k included in the groups Gr1, Gr3, and Gr4 are inactivated. After that, the tester 600 outputs the output enable signal /OE to the semiconductor memory devices C11 to C1k, C21 to C2k, C31 to C3k, and C41 to C4k, and data can be read from the semiconductor memory devices C21 to C2k which are activated. An address is outputted from the tester 600 to the semiconductor memory devices C11 to C1k, C21 to C2k, C31 to C3k, and C41 to C4k and the data is read from the semiconductor memory devices C21 to C2k which are activated. After that, whether the read data coincides with the output data or not is determined by the above-described method, and the reading test on the semiconductor memory devices C21 to C2k included in the group Gr2 is finished.

Subsequently, in the period T4 shown in FIG. 11, data is read from the semiconductor memory devices C31 to C3k included in the group Gr3. In this case, the tester 600 outputs the chip enable signal /CE of the L level to the semiconductor memory devices C11 to C1k, C21 to C2k, C31 to C3k, and C41 to C4k included in the groups Gr1 to Gr4, and outputs the selection signal GA0 of the L level, the selection signal GA1 of the H level, and the control signal PE of the L level to the decoding circuit 80.

The decoding circuit 80 outputs an L level signal to the semiconductor memory devices C31 to C3k included in the group Gr3, and outputs an H level signal to the semiconductor memory devices C11 to C1k, C21 to C2k, and C41 to C4k included in the groups Gr1, Gr2, and Gr4. As a result, the semiconductor memory devices C31 to C3k included in the group Gr3 are activated, and the semiconductor memory devices C 1 to C1k, C21 to C2k, and C41 to C4k included in the groups Gr1, Gr2, and Gr4 are inactivated. After that, the tester 600 outputs the output enable signal /OE to the semiconductor memory devices C11 to C1k, C21 to C2k, C31 to C3k, and C41 to C4k, and data can be read from the semiconductor memory devices C31 to C3k which are activated. An address is outputted from the tester 600 to the semiconductor memory devices C11 to C1k, C21 to C2k, C31 to C3k, and C41 to C4k and the data is read from the semiconductor memory devices C31 to C3k which are activated. After that, whether the read data coincides with the output data or not is determined by the above-described method, and the reading test on the semiconductor memory devices C31 to C3k included in the group Gr3 is finished.

Finally, in the period T5 shown in FIG. 11, data is read from the semiconductor memory devices C41 to C4k included in the group Gr4. In this case, the tester 600 outputs the chip enable signal /CE of the L level to the semiconductor memory devices C11 to C1k, C21 to C2k, C31 to C3k, and C41 to C4k included in the groups Gr1 to Gr4, and outputs the selection signals GA0 and GA1 of the H level and the control signal PE of the L level to the decoding circuit 80.

The decoding circuit 80 outputs an L level signal to the semiconductor memory devices C41 to C4k included in the group Gr4, and outputs an H level signal to the semiconductor memory devices C11 to C1k, C21 to C2k, and C31 to C3k included in the groups Gr1, Gr2, and Gr3. As a result, the semiconductor memory devices C41 to C4k included in the group Gr4 are activated, and the semiconductor memory devices C11 to C1k, C21 to C2k, and C31 to C3k included in the groups Gr1 to Gr3 are inactivated. After that, the tester 600 outputs the output enable signal /OE to the semiconductor memory devices C11 to C1k, C21 to C2k, C31 to C3k, and C41 to C4k, and data can be read from the semiconductor memory devices C41 to C4k which are activated. An address is outputted from the tester 600 to the semiconductor memory devices C11 to C1k, C21 to C2k, C31 to C3k, and C41 to C4k and the data is read from the semiconductor memory devices C41 to C4k which are activated. After that, whether the read data coincides with the output data or not is determined by the above-described method, and the reading test on the semiconductor memory devices C41 to C4k included in the group Gr4 is finished.

The operation test on the semiconductor memory devices C11 to C1k, C21 to C2k, C31 to C3k, and C41 to C4k included in the groups Gr1 to Gr4 fabricated on the semiconductor wafer 650 is finished. The operation test of the semiconductor memory devices included in the four groups is sequentially conducted by the above-described method, and the operation test on all of the semiconductor memory devices fabricated on the semiconductor wafer 650 is finished.

Figure 12:
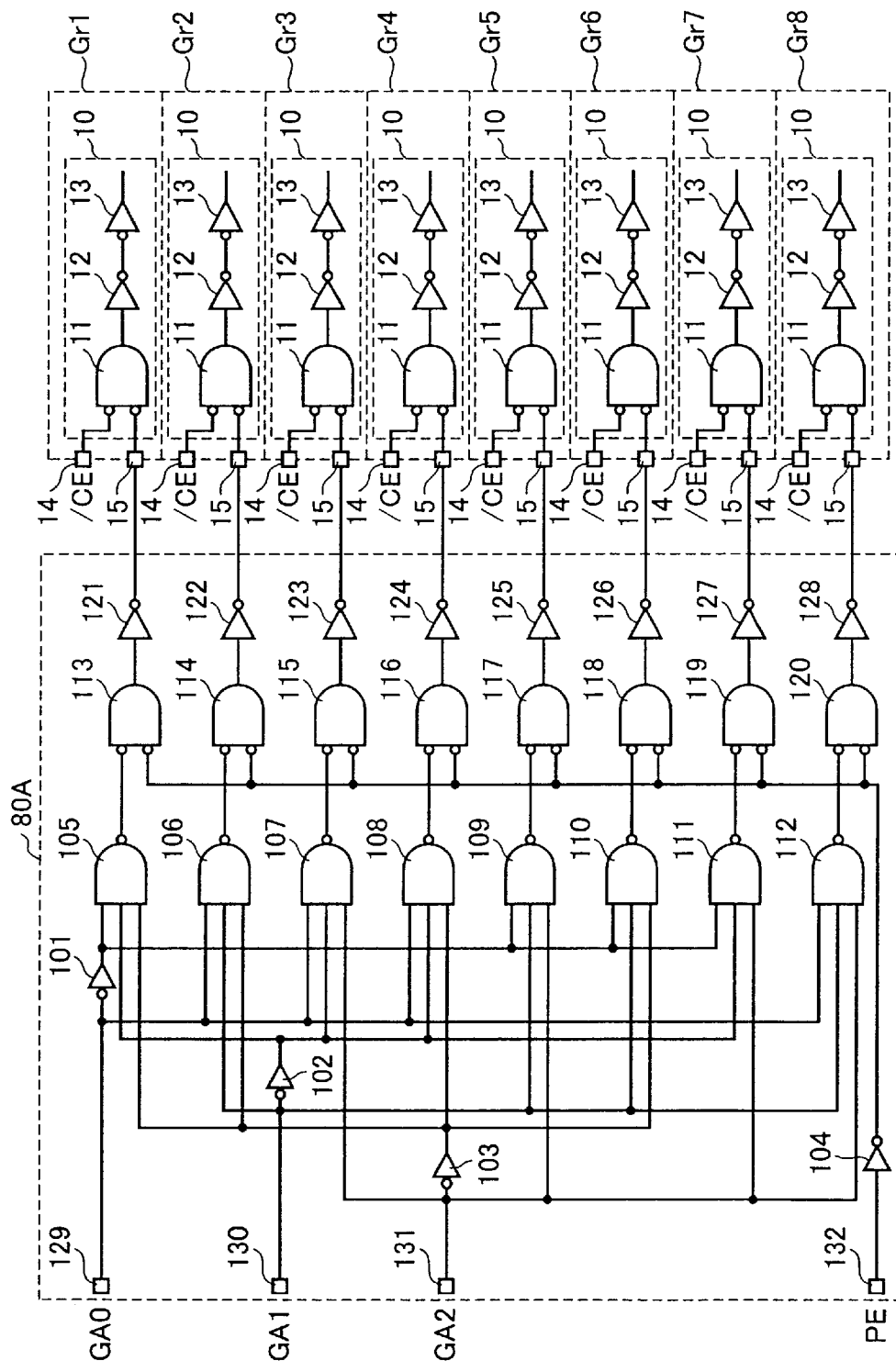
FIG. 12 is another circuit diagram of a circuit fabricated on the semiconductor wafer according to the third embodiment of the invention.

The decoding circuit in the third embodiment is not limited to the decoding circuit 80 shown in FIG. 9, but may be a decoding circuit 80A shown in FIG. 12. The decoding circuit 80A has inverters 101 to 104 and 121 to 128, NAND gates 105 to 112, NOR gates 113 to 120, and pads 129 to 132. The pad 129 receives the selection signal GA0, the pad 130 receives the selection signal GA1, the pad 131 receives the selection signal GA2, and the pad 132 receives the control signal PE.

When the control signal PE of the H level is input, the decoding circuit 80A outputs an L level signal from the inverters 121 to 128. By switching the logical level of each of the selection signals GA0 to GA2 and the control signal PE, in a manner similar to FIG. 9, the decoding circuit 80A selectively outputs an L level signal from the inverters 121 to 128. The decoding circuit 80A is therefore a decoding circuit which can activate the semiconductor memory devices included in eight groups Gr1 to Gr8 on the group unit basis. By using the decoding circuit 80A shown in FIG. 12, time of the operation test can be further shortened.

The semiconductor memory devices 100 which have passed the operation test immediately after the wafer process are separated from each other by cutting the semiconductor wafer. After the semiconductor memory device 100 is packaged, an operation test is carried out again, and the satisfactory semiconductor memory device 100 is shipped. Since the final semiconductor memory device 100 includes the activating/inactivating circuit 10, signals are supplied from the pad 15 so that one of the terminals of the NOR gate 11 is set to the L level, and shipment is made. As a result, the activating/inactivating circuit 10 outputs an activation or inactivation signal to the input/output interface circuit 20 in response to the logic level of the chip enable signal /CE. Consequently, in a manner similar to the conventional technique, the semiconductor memory device can be activated or inactivated by the chip enable signal /CE.

According to the third embodiment, a plurality of semiconductor memory devices and a decoding circuit are formed on a semiconductor wafer, the plurality of semiconductor memory devices are divided into a plurality of groups, and the semiconductor memory devices included in the groups are activated in a lump by the decoding circuit at the time of writing data. The semiconductor memory devices are sequentially activated on the group unit basis. Thus, the operation test time after the wafer process can be largely shortened. Particularly, the time of the operation test in the flash memory requiring long time to write data can be largely shortened.

Fourth Embodiment

Figure 13:
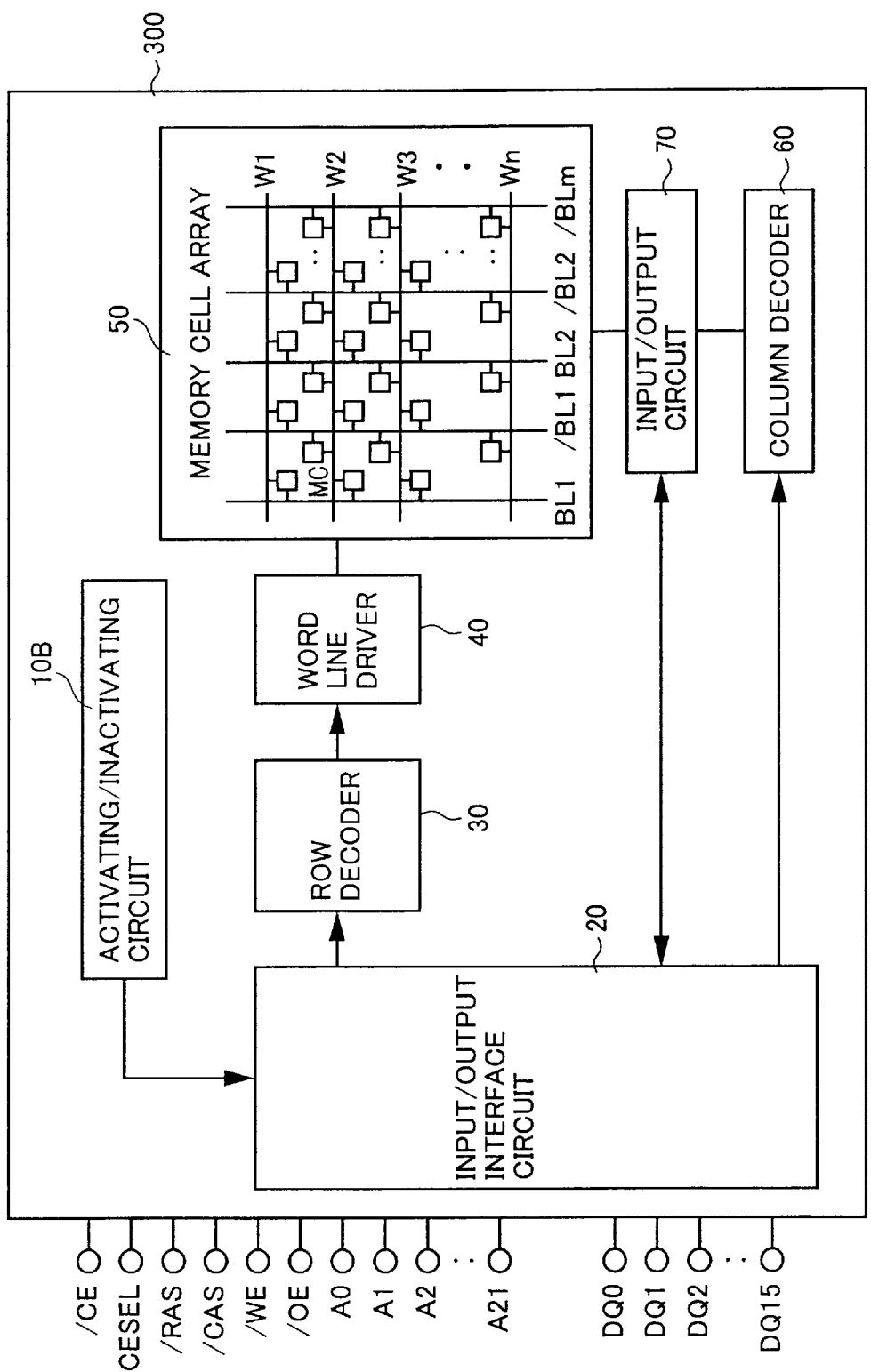
FIG. 13 is a schematic block diagram showing the configuration of a semiconductor memory device according to a fourth embodiment of the invention.

Referring to FIG. 13, a semiconductor memory device 300 according to a fourth embodiment is similar to the semiconductor memory device 100 except that the activating/inactivating circuit 10 in the semiconductor memory device 100 shown in FIG. 1 is replaced by an activating/inactivating circuit 10B. The activating/inactivating circuit 10B generates an activation or inactivation signal on the basis of the chip enable signal /CE and a chip enable selection signal CESEL, and outputs the generated activation or inactivation signal to the input/output interface circuit 20.

Referring to FIG. 14, the activating/inactivating circuit 10B has an AD converter 21, a decoding circuit 22, a selector circuit 23, and inverters 24 to 26. A pad 27 receives the chip enable signal /CE and a pad 28 receives a chip enable selection signal CESEL. In the fourth embodiment, when the operation test of the semiconductor memory device 300 is conducted, a chip enable signal which is an analog signal is supplied from the pad 27. When the semiconductor memory device 300 operates normally, the chip enable signal /CE which is a digital signal is supplied from the pad 27.

The AD converter 21 converts an analog signal into a digital signal. The decoding circuit 22 generates a signal of the L or H level on the basis of the digital signal from the AD converter 21 and outputs the generated signal to the selector circuit 23. When the chip enable selection signal CESEL supplied from the pad 28 is at the H level, the selector circuit 23 selects the output signal of the decoding circuit 22. When the chip enable selection signal CESEL is at the L level, the selector circuit 23 selects the chip enable signal /CE supplied from the pad 27. The inverters 24 to 26 invert an input signal.

Referring to FIG. 15, the decoding circuit 22 has the same configuration as that of the decoding circuit 80 shown in FIG. 9. On the basis of the selection signals GA0 and GA1 and the control signal PE as output signals from the AD converter 21, the decoding circuit 22 outputs a signal of the H or L level from the inverters 92 to 95.

Referring to FIG. 16, the function of the AD converter 21 in the activating/inactivating circuit 10B shown in FIG. 14 will be described. When an operation test of the semiconductor memory device 300 is conducted, the AD converter 21 receives the chip enable signal /CE as a voltage value of 0V, 0.5V, 1.0V, 1.5V or 2.0V. When the chip enable signal /CE having a voltage value of 0V is input, the AD converter 21 generates the control signal PE having a digital value of "1", the selection signal GA0 having the digital value of "1" (or "0"), and the selection signal GA1 having the digital value of "1" (or "0"). When the chip enable signal /CE having the voltage value of 0.5V is supplied, the AD converter 21 generates the control signal PE having the digital value of "0", the selection signal GA0 having the digital value of "1", and the selection signal GA1 having the digital value of "1". When the chip enable signal /CE having the voltage value of 1.0V is supplied, the AD converter 21 generates the control signal PE having the digital value of "0", the selection signal GA0 having the digital value of "0", and the selection signal GA1 having the digital value of "1". When the chip enable signal /CE having the voltage value of 1.5V is supplied, the AD converter 21 generates the control signal PE having the digital value of "0", the selection signal GA0 having the digital value of "1", and the selection signal GA1 having the digital value of "0". When the chip enable signal /CE having the voltage value of 2.0V is supplied, the AD converter 21 generates the control signal PE having the digital value of "0", the selection signal GA0 having the digital value of "0", and the selection signal GA1 having the digital value of "0". The digital values "1" and "0" denote the logic levels of the H level and the L level, respectively.

Referring again to FIGS. 14 and 15, when the chip enable signal /CE having the voltage value of 0V is input from the pad 27, the AD converter 21 generates and outputs the control signal PE of the H level, and the selection signals GA0 and GA1 of the H level, and the decoding circuit 22 outputs an L level signal from each of the inverters 92 to 95. When the chip enable signal /CE having the voltage value of 0.5V is input from the pad 27, the AD converter 21 generates and outputs the control signal PE of the L level, and the selection signals GA0 and GA1 of the H level, and the decoding circuit 22 outputs an L level signal from the inverter 95. When the chip enable signal /CE having the voltage value of 1.0V is input from the pad 27, the AD converter 21 generates and outputs the control signal PE of the L level, the selection signal GA0 of the L level, and the selection signal GA1 of the H level, and the decoding circuit 22 outputs an L level signal from the inverter 94 and output an H level signal from each of the inverters 92, 93, and 95. When the chip enable signal /CE having the voltage value of 1.5V is input from the pad 27, the AD converter 21 generates and outputs the control signal PE of the L level, the selection signal GA0 of the H level, and the selection signal GA1 of the L level, and the decoding circuit 22 outputs a L level signal from the inverter 93 and an H level signal from each of the inverters 92, 94, and 95. When the chip enable signal /CE having the voltage value of 2.0V is input from the pad 27, the AD converter 21 generates and outputs the control signal PE of the L level and the selection signals GA0 and GA1 of the L level, and the decoding circuit 22 outputs an L level signal from the inverter 92 and an H level signal from the inverters 93 to 95. In such a manner, the decoding circuit 22 outputs L level signals from the all of inverters 92 to 95 or selectively outputs L level signals in response to the voltage value of the chip enable signal /CE.

Figure 17:
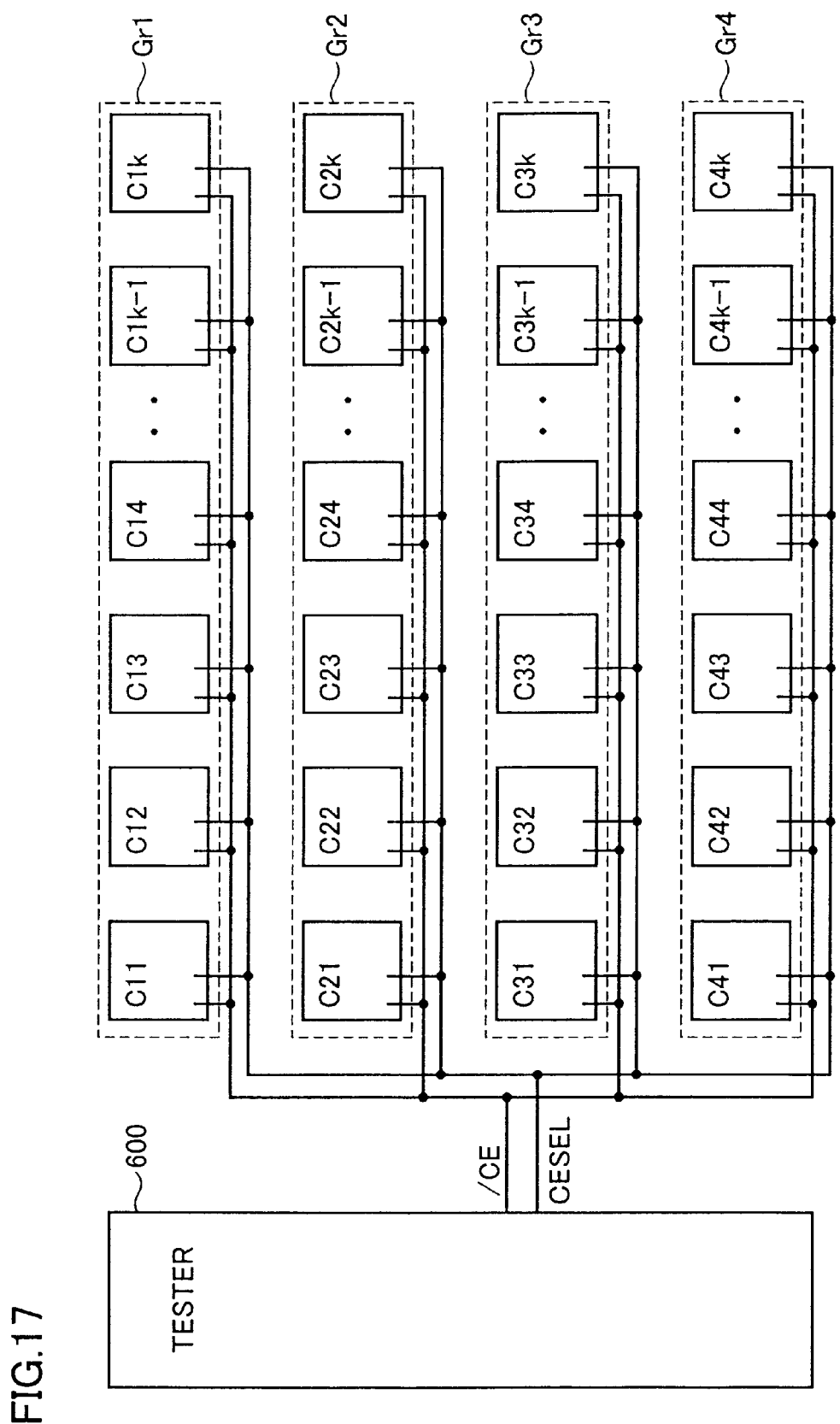
FIG. 17 is a diagram showing the connecting relation between the semiconductor memory devices and the tester according to the fourth embodiment.

Referring to FIG. 17, the connecting method between the semiconductor memory devices 300 and the tester in the operation test according to the fourth embodiment will be described. The plurality of semiconductor memory devices 300 are divided into the four groups Gr1 to Gr4, and the operation test is conducted on the group unit basis. The semiconductor memory devices C11 to C1k construct the group Gr1, the semiconductor memory devices C21 to C2k construct the group Gr2, the semiconductor memory devices C31 to C3k construct the group Gr3, and the semiconductor memory devices C41 to C4k construct the group Gr4. The tester 600 outputs the chip enable signal /CE and the chip enable selection signal CESEL as analog signals to the semiconductor memory devices C11 to C1k, C21 to C2k, C31 to C3k, and C41 to C4k included in the groups Gr1 to Gr4.

Figure 18:
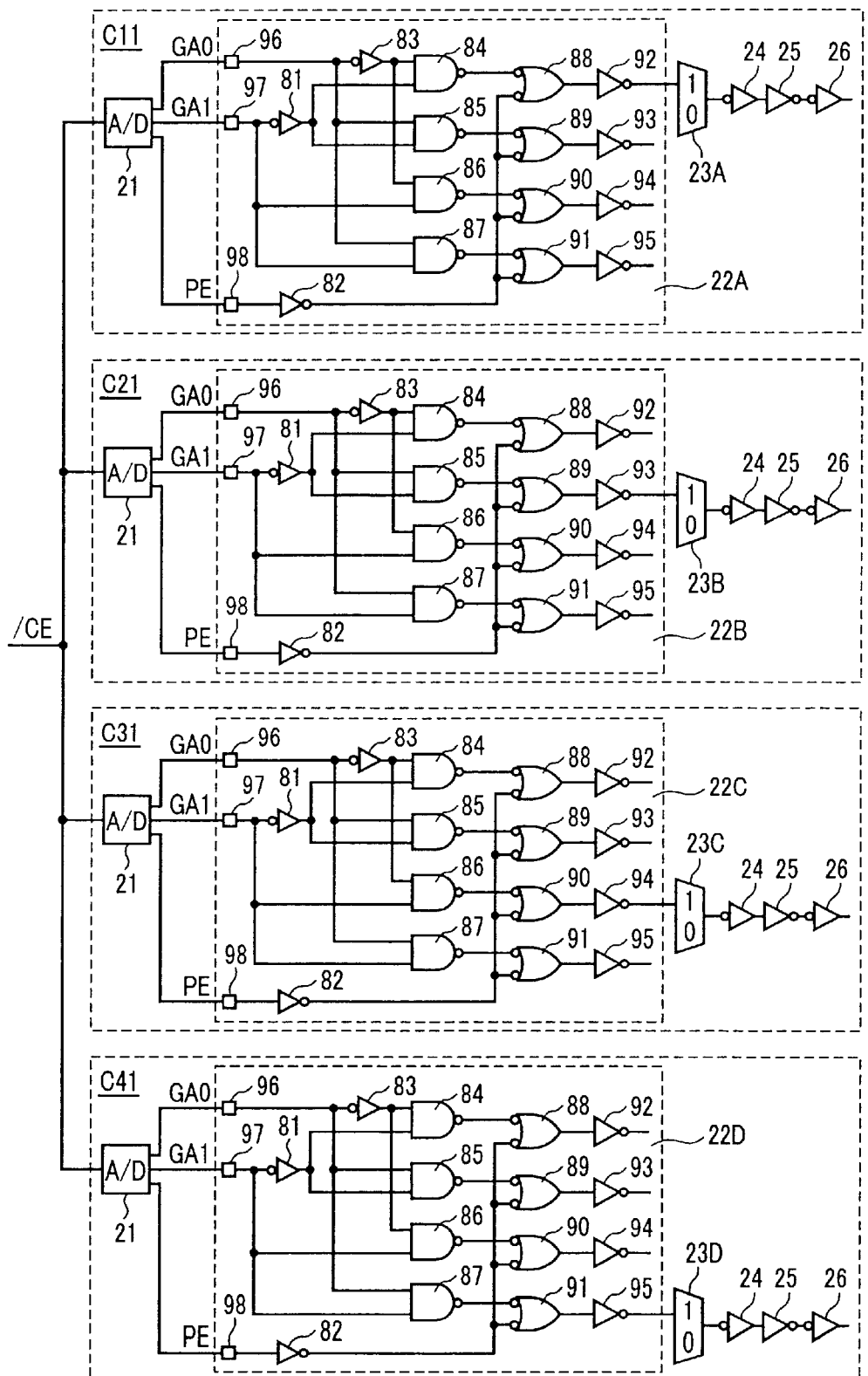
FIG. 18 is a circuit diagram of activating/inactivating circuits provided for four kinds of semiconductor memory devices classified in four groups.

With reference to FIG. 18, activation of the semiconductor memory device C11 included in the group Gr1, the semiconductor memory device C21 included in the group Gr2, the semiconductor memory device C31 included in the group Gr3, and the semiconductor memory device C41 included in the group Gr4 will now be described. In FIG. 18, the chip enable selection signal CESEL outputted from the tester 600 is not shown.

The semiconductor memory device C11 in the group Gr1 includes a decoding circuit 22A, and the inverter 92 in the decoding circuit 22A and a selector circuit 23A are connected to each other. The semiconductor memory device C21 in the group Gr2 includes a decoding circuit 22B, and the inverter 93 in the decoding circuit 22B and a selector circuit 23B are connected to each other. Further, the semiconductor memory device C31 in the group Gr3 includes a decoding circuit 22C, and the inverter 94 in the decoding circuit 22C and a selector circuit 23C are connected to each other. The semiconductor memory device C41 in the group Gr4 includes a decoding circuit 22D, and the inverter 95 in the decoding circuit 22D and a selector circuit 23D are connected to each other.

When the chip enable signal /CE having the voltage value of 0V is supplied to the semiconductor memory devices C11, C21, C31, and C41, all of the inverters 92 to 95 in the decoding circuits 22A, 22B, 22C, and 22D output L level signals. The selector circuits 23A, 23B, 23C, and 23D connected to the decoding circuits 22A, 22B, 22C, and 22D output L level signals. As a result, all of the semiconductor memory devices C11, C21, C31, and C41 are activated.

When the chip enable signal /CE having the voltage value of 0.5V is supplied to the semiconductor memory devices C11, C21, C31, and C41, the inverters 95 in the decoding circuits 22A, 22B, 22C, and 22D output an L level signal, and the inverters 92 to 94 output an H level signal. As a result, only the semiconductor memory device C41 having the selector circuit 23D connected to the inverter 95 is activated. The semiconductor memory devices C11, C21, and C3 having the selector circuits 23A, 23B, and 23C connected to the inverters 92 to 94, respectively, are inactivated. When the chip enable signal /CE having the voltage value of 1.0 V is supplied to the semiconductor memory devices C11, C21, C31, and C41, the inverters 94 in the decoding circuits 22A, 22B, 22C, and 22D output an L level signal, and the inverters 92, 93, and 95 output an H level signal. As a result, only the semiconductor memory device C31 having the selector circuit 23C connected to the inverter 94 is activated, and the semiconductor memory devices C11, C21, and C41 having the selector circuits 23A, 23B, and 23D connected to the inverters 92, 93, and 95, respectively, are inactivated. Further, when the chip enable signal /CE having the voltage value of 1.5 V is supplied to the semiconductor memory devices C11, C21, C31, and C41, the inverters 93 in the decoding circuits 22A, 22B, 22C, and 22D output an L level signal, and the inverters 92, 94, and 95 output an H level signal. As a result, only the semiconductor memory device C21 having the selector circuit 23B connected to the inverter 93 is activated, and the semiconductor memory devices C11, C31, and C41 having the selector circuits 23A, 23C, and 23D connected to the inverters 92, 94, and 95, respectively, are inactivated. Further, when the chip enable signal /CE having the voltage value of 2.0 V is supplied to the semiconductor memory devices C11, C21, C31, and C41, the inverters 92 in the decoding circuits 22A, 22B, 22C, and 22D output an L level signal, and the inverters 93 to 95 output an H level signal. As a result, only the semiconductor memory device C11 having the selector circuit 23A connected to the inverter 92 is activated, and the semiconductor memory device C21, C31, and C41 having the selector circuits 23B, 23C, and 23D connected to the inverters 93 to 95, respectively, are inactivated.

As described above, by converting the voltage value of the chip enable signal /CE, the semiconductor memory devices C11, C21, C31, and C41 included in the groups Gr1 to Gr4, respectively, can be activated in a lump or selectively.

The decoding circuit 22A and the selector circuit 23A are connected to each of the semiconductor memory devices C12 to C1k included in the group Gr1 in a manner similar to the semiconductor memory device C11. The decoding circuit 22B and the selector circuit 23B are connected to each of the semiconductor memory devices C22 to C2k included in the group Gr2 in a manner similar to the semiconductor memory device C21. The decoding circuit 22C and the selector circuit 23C are connected to each of the semiconductor memory devices C32 to C3k included in the group Gr3 in a manner similar to the semiconductor memory device C31. The decoding circuit 22D and the selector circuit 23D are connected to each of the semiconductor memory devices C42 to C4k included in the group Gr4 in a manner similar to the semiconductor memory device C41.

The semiconductor memory devices C11 to C1k, C21 to C2k, C31 to C3k, and C41 to C4k are therefore activated in a lump or selectively in response to the voltage value of the chip enable signal /CE supplied from the tester 600.

Figure 19:
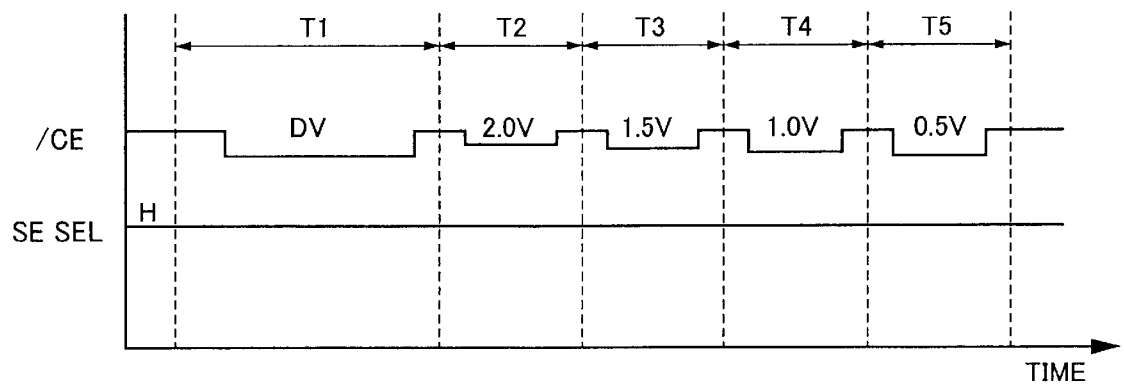
FIG. 19 is a timing chart of signals at the time of an operation test in the fourth embodiment.

Referring to FIG. 19, the operation in the operation test in the fourth embodiment will be described. In the period T1 shown in FIG. 19, data is simultaneously written to the semiconductor memory devices C11 to C1k, C21 to C2k, C31 to C3k, and C41 to C4k included in the groups Gr1 to Gr4, respectively. In the period T2, the data is read from the semiconductor memory devices C11 to C1k included in the group Gr1. In the period T3, data is read from the semiconductor memory devices C21 to C2k included in the group Gr2. In the period T4, data is read from the semiconductor memory devices C31 to C3k included in the group Gr3. In the period T5, data is read from the semiconductor memory devices C41 to C4k included in the group Gr4.

In the period T1, the tester 600 outputs the chip enable signal /CE with the voltage value of 0V and the chip enable selection signal CESEL of the H level. By the signals, all of the semiconductor memory devices C11 to C1k, C21 to C2k, C31 to C3k, and C41 to C4k included in the groups Gr1 to Gr4 are activated. After that, as described in the third embodiment, the tester 600 outputs the write enable signal /WE and an address to the semiconductor memory devices C11 to C1k, C21 to C2k, C31 to C3k, and C41 to C4k, and data is written to each of the semiconductor memory devices.

In the period T2, the tester 600 outputs the chip enable signal /CE with the voltage value of 2.0V and the chip enable selection signal CESEL of the H level. By the signals, all of the semiconductor memory devices C11 to C1k to C1k included in the group Gr1 are activated, and the semiconductor memory devices C21 to C2k, C31 to C3k, and C41 to C4k included in the groups Gr2 to Gr4 are inactivated. After that, as described in the third embodiment, the tester 600 outputs the output enable signal /OE and an address to the semiconductor memory devices C11 to C1k, C21 to C2k, C31 to C3k, and C41 to C4k, and data is read from the semiconductor memory devices C11 to C1k which are activated.

In the period T3, the tester 600 outputs the chip enable signal /CE with the voltage value of 1.5V and the chip enable selection signal CESEL of the H level. By the signals, the semiconductor memory devices C21 to C2k included in the group Gr2 are activated, and the semiconductor memory devices C11 to C1k, C31 to C3k, and C41 to C4k included in the groups Gr1, Gr3, and Gr4 are inactivated. After that, as described in the third embodiment, the tester 600 outputs the output enable signal /OE and an address to the semiconductor memory devices C11 to C1k, C21 to C2k, C31 to C3k, and C41 to C4k, and data is read from the semiconductor memory devices C21 to C2k which are activated.

In the period T4, the tester 600 outputs the chip enable signal /CE with the voltage value of 1.0V and the chip enable selection signal CESEL of the H level. By the signals, the semiconductor memory devices C31 to C3k included in the group Gr3 are activated, and the semiconductor memory devices C11 to C1k, C21 to C2k, and C41 to C4k included in the groups Gr1, Gr2, and Gr4 are inactivated. After that, as described in the third embodiment, the tester 600 outputs the output enable signal /OE and an address to the semiconductor memory devices C11 to C1k, C21 to C2k, C31 to C3k, and C41 to C4k, and data is read from the semiconductor memory devices C31 to C3k which are activated.

In the period T5, the tester 600 outputs the chip enable signal /CE with the voltage value of 0.5V and the chip enable selection signal CESEL of the H level. By the signals, the semiconductor memory devices C41 to C4k included in the group Gr4 are activated, and the semiconductor memory devices C11 to C1k, C21 to C2k, and C31 to C3k included in the groups Gr1 to Gr3 are inactivated. After that, as described in the third embodiment, the tester 600 outputs the output enable signal /OE and an address to the semiconductor memory devices C11 to C1k, C21 to C2k, C31 to C3k, and C41 to C4k, and data is read from the semiconductor memory devices C41 to C4k which are activated.

In such a manner, after dividing the plurality of semiconductors into four groups, the operation test is carried out.

In the semiconductor memory device 300 according to the fourth embodiment, the activating/inactivating circuit 10B may have the decoding circuit 80A shown in FIG. 12 in place of the decoding circuit 22 shown in FIG. 15. In this case, the operation test is conducted after dividing the plurality of semiconductor memory devices into eight groups. The tester 600 outputs the chip enable signal /CE with the voltage value which changes in eight levels.

After the operation test on the semiconductor memory device 300 is finished, the chip enable selection signal CESEL is set to the L level and shipment is made. When the chip enable selection signal CESEL is set to the H level, the selector circuit 23 selects the chip enable signal /CE supplied from the pad 27. In normal operation, since the chip enable signal /CE is a signal of the H or L level, when the chip enable signal /CE of the L level is supplied from the pad 27, the selector circuit 23 outputs the chip enable signal /CE of the L level to the inverter 24. The activating/inactivating circuit 10B outputs an H level signal to make the input/output interface circuit 20 active. On the other hand, when the chip enable signal /CE of the H level is input, the activating/inactivating circuit 10B outputs an L level signal to make the input/output interface circuit 20 inactive. In normal operation, therefore, by changing the logical level of the chip enable signal /CE, the semiconductor memory device 300 can be activated or inactivated.

According to the fourth embodiment, the semiconductor memory device has the activating/inactivating circuit for generating an activation signal in response to the voltage value. Consequently, by dividing a plurality of semiconductor memory devices into a plurality of groups and changing the voltage value to be outputted to the semiconductor memory devices, data can be simultaneously written to the plurality of semiconductor memory devices and can be selectively read on the group unit basis. As a result, the operation test on the semiconductor memory device can be efficiently conducted.

Fifth Embodiment

Figure 20:
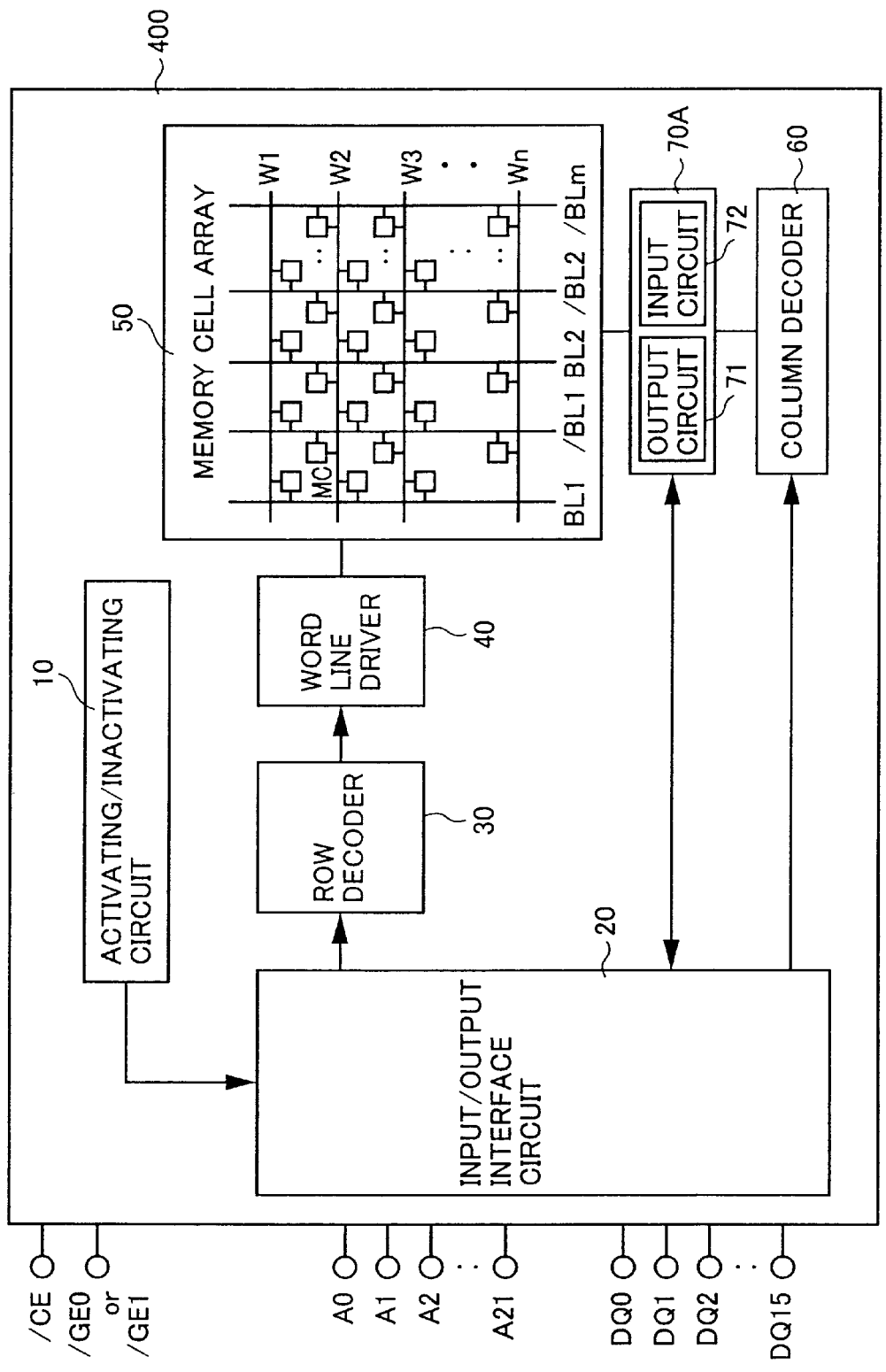
FIG. 20 is a schematic block diagram showing the configuration of a semiconductor memory device according to a fifth embodiment of the invention.

Referring to FIG. 20, the configuration of a semiconductor memory device 400 according to a fifth embodiment will be described. The semiconductor memory device 400 is similar to the semiconductor memory device 100 except that an input/output circuit 70A is used in place of the input/output circuit 70 in the semiconductor memory device 100 shown in FIG. 1.

The input/output circuit 70A is comprised of an output circuit 71 and an input circuit 72. When one of the bit line pairs BL1 and /BL1 to BLm and /BLm, which is designated by the column decoder 60 is activated, the output circuit 71 converts data which is an analog signal read from the memory cell MC via the activated bit line pair into a digital signal, and outputs the digital signal as read data to the input/output terminals DQ0 to DQ15 via the input/output interface circuit 20. When one of the bit line pairs BL1 and /BL1 to BLm and /BLm, which is designated by the column decoder 60 is activated, the input circuit 72 writes the input data to the activated bit line pair via the input/output interface circuit 20.

Figure 21:
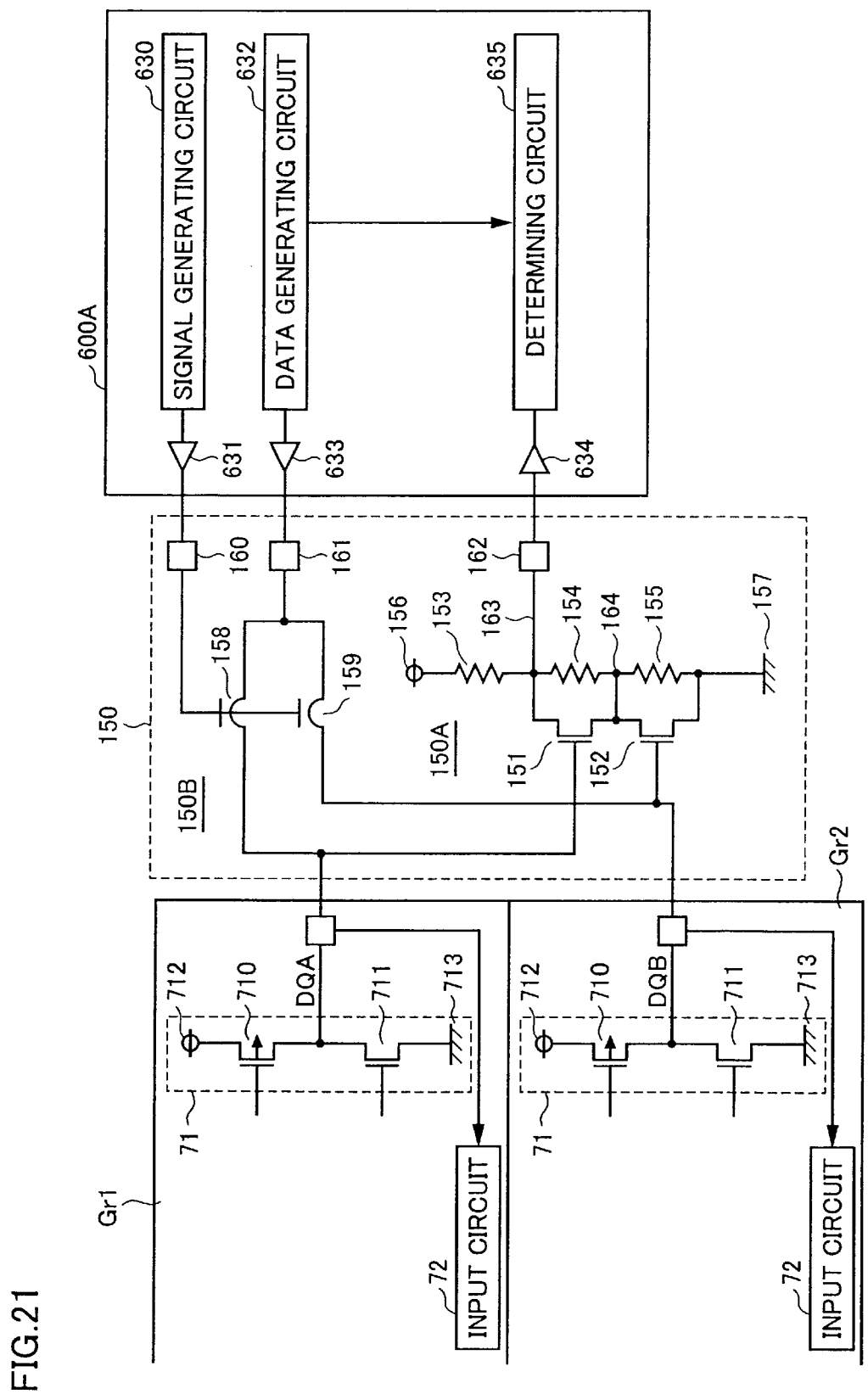
FIG. 21 is a circuit diagram showing the connecting relation between the semiconductor memory devices and a tester in the fifth embodiment.
Figure 22:
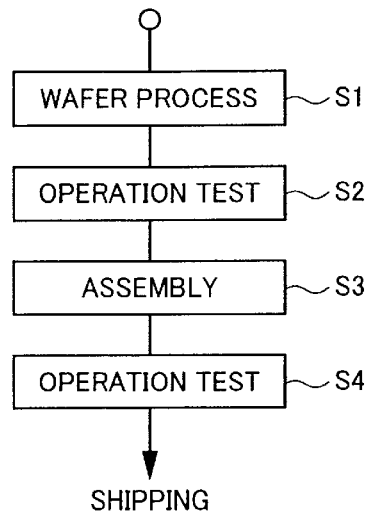
FIG. 22 is a flowchart showing a process of fabricating the semiconductor memory device.
Figure 23:
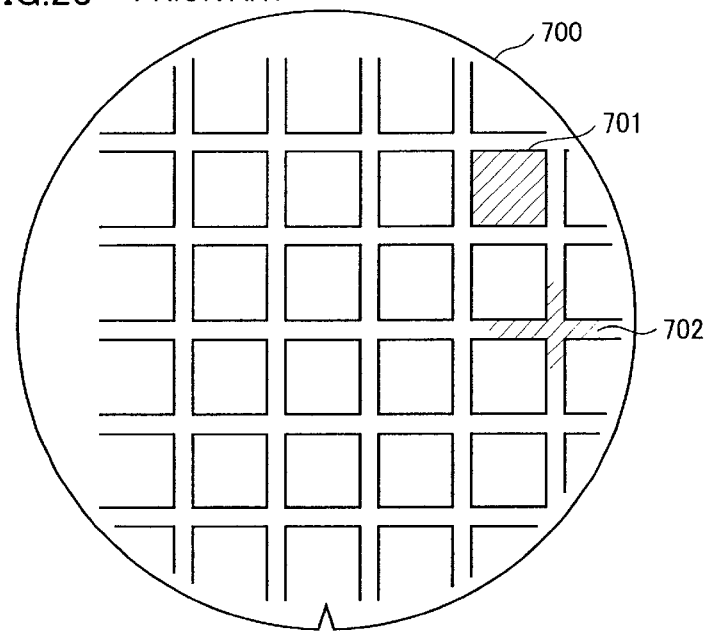
FIG. 23 is a plan view of a semiconductor wafer on which semiconductor memory devices are fabricated.
Figure 24:
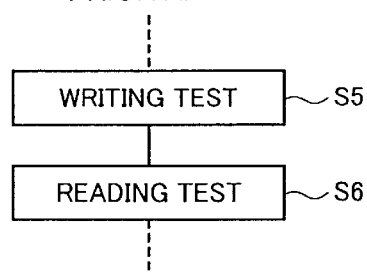
FIG 24 is a flowchart of an operation test shown in the flowchart of FIG. 22.
Figure 25:
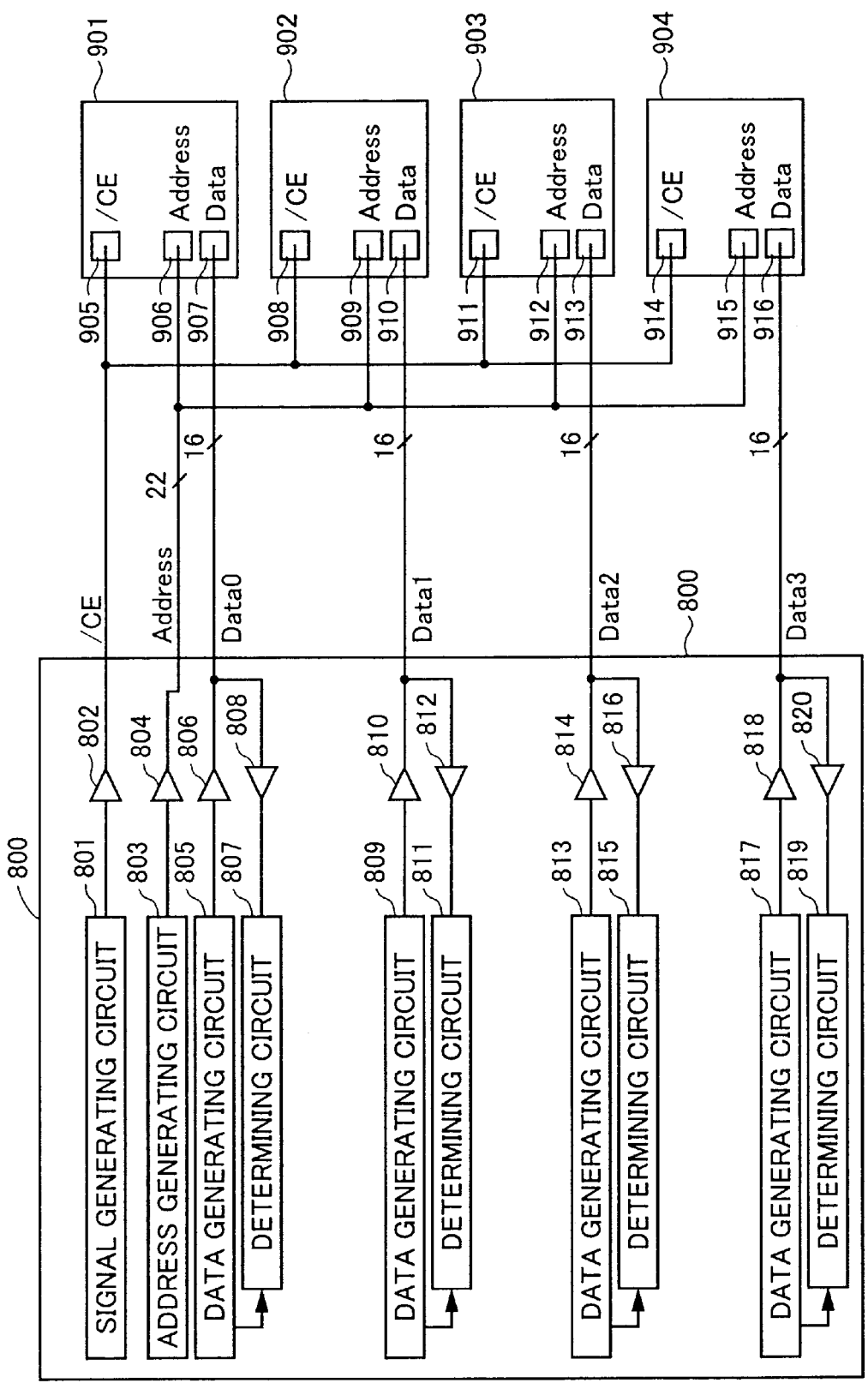
FIG. 25 is a diagram showing the connecting relation between conventional semiconductor memory devices and a tester at the time of an operation test.
Figure 26:
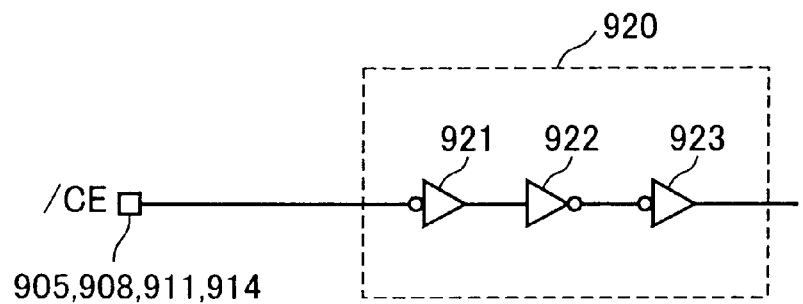
FIG. 26 is a circuit diagram of an activating/inactivating circuit included in e conventional semiconductor memory device.
Figure 27:
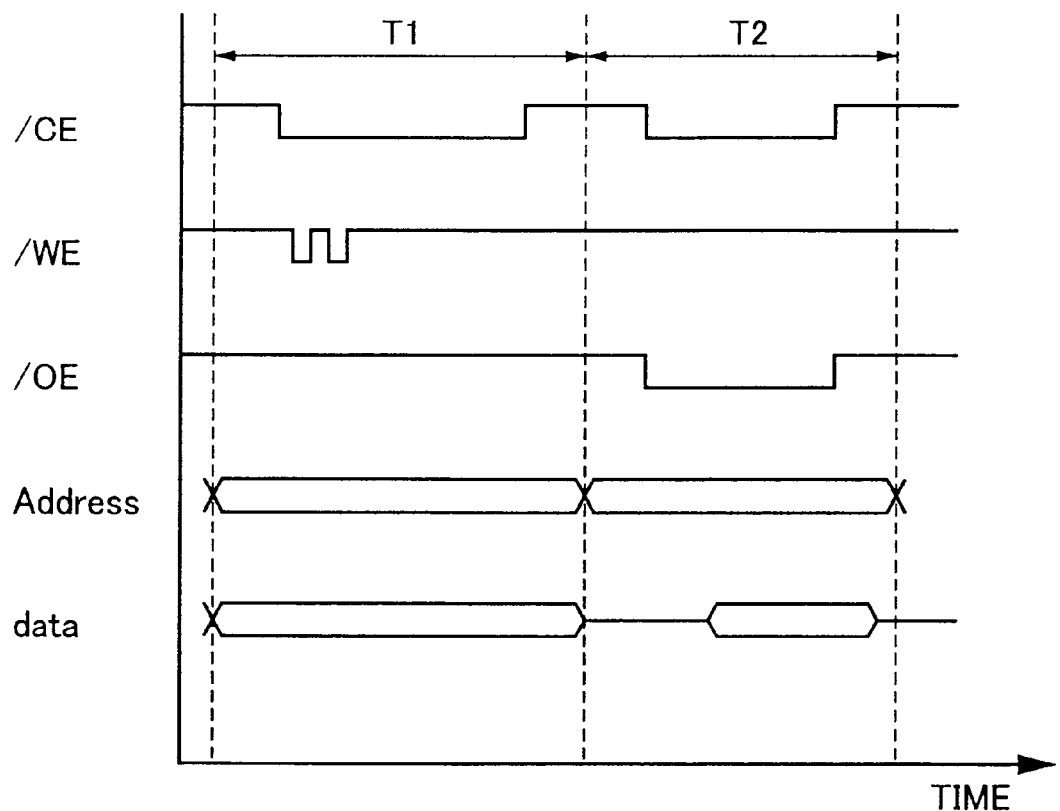
FIG. 27 is a timing chart of signals in an operation test for the conventional semiconductor memory device.

Referring to FIG. 21, the output circuit 71 has a P-channel MOS transistor 710 and an N-channel MOS transistor 711. The P-channel MOS transistor 710 and the N-channel MOS transistor 711 are connected in series between a power source node 712 and an earth node 713. In each of the P-channel MOS transistor 710 and the N-channel MOS transistor 711, a signal of the H or L level corresponding to data "1" or "0" read from the memory cell MC is received by the gate terminal. Consequently, when data "1" is supplied, the output circuit 71 outputs an L level signal. When data "0" is supplied, the output circuit 71 outputs an H level signal. The input circuit 72 writes data from input/output terminals DQA and DQB to an activated memory cell.

For the operation test in the fifth embodiment, an input/output switching circuit 150 is fabricated in an area where no semiconductor memory device is fabricated. The input/output switching circuit 150 is comprised of a DA converter 150A and an input selecting circuit 150B.

The DA converter 150A has N-channel MOS transistors 151 and 152, resistors 153 to 155, and a pad 162. The resistors 153 to 155 are connected in series between a power source node 156 and an earth node 157. The N-channel MOS transistor 151 is connected to both terminals of the resistor 154 so as to be in parallel with the resistor 154. The N-channel MOS transistor 152 is connected to both terminals of the resistor 155 so as to be in parallel with the resistor 155. The resistance values of the resistors 153 to 155 are determined so that the potential of a node 163 is 2.0V when a signal supplied to the gate terminals of the N-channel MOS transistors 151 and 152 is L level, the potential of the node 163 is 1.5V when a signal supplied to the gate terminal of the N-channel MOS transistor 151 is L level and a signal supplied to the gate terminal of the N-channel MOS transistor 152 is H level, the potential of the node 163 is 1.0V when a signal supplied to the gate terminal of the N-channel MOS transistor 151 is H level and the signal supplied to the gate terminal of the N-channel MOS transistor 152 is L level, and the potential of the node 163 is 0.5V when the signal supplied to the gate terminals of the N-channel MOS transistors 151 and 152 is H level.

The input selecting circuit 150B has transfer gates 158 and 159 and pads 160 and 161. The transfer gates 158 and 159 are turned on and off by a control signal supplied via the pad 160. When the transfer gates 158 and 159 are turned on, input data received via the pad 161 is supplied to semiconductor memory devices included in the groups Gr1 and GR2.

A tester 600A includes a signal generating circuit 630, a data generating circuit 632, drivers 631 and 633, a comparator 634, and a determining circuit 635. The signal generating circuit 630 generates a control signal of the H or L level to turn on/off the transfer gates 158 and 159. The driver 631 converts the control signal of the H or L level to a predetermined voltage value and outputs the voltage value to the pad 160 of the input selecting circuit 150B. The data generating circuit 632 generates data to be written. The driver 633 converts the write data generated by the data generating circuit 632 to a predetermined voltage value and outputs the voltage value to the pad 161 of the input selecting circuit 150B. The comparator 634 receives the potential on the node 163 of the DA converter 150A via the pad 162, and performs a comparing operation so that the received potential is determined as 0.5V, 1.0V, 1.5V, or 2.0V. The determining circuit 635 generates and stores a data pattern written to a semiconductor memory device included in the group Gr1 and a semiconductor memory device included in the group Gr2 on the basis of the write data from the data generating circuit 632, and recognizes data patterns read from the semiconductor memory devices included in the groups Gr1 and Gr2 on the basis of the result of the comparison from the comparator 634. The determining circuit 635 compares the recognized data pattern with a stored data pattern and determines whether the read data pattern coincides with the written data pattern or not.

The operation in the operation test of the semiconductor memory device 400 will now be described. In the case of writing data to semiconductor memory devices included in the groups Gr1 and Gr2, the signal generating circuit 630 in the tester 600A generates a control signal of the H level. The driver 631 converts the control signal of the H level generated by the signal generating circuit 630 to a predetermined voltage value and outputs the control signal to the pad 160 of the input selecting circuit 150B. The data generating circuit 632 generates write data, and the driver 633 converts the data generated by the data generating circuit 632 to a predetermined voltage value and outputs the predetermined voltage value to the pad 161 of the input selecting circuit 150B. The transfer gates 158 and 159 are turned on and the write data supplied via the pad 161 is outputted to an input/output terminal DQA of a semiconductor memory device included in the group Gr1 and an input/output terminal DQB of a semiconductor memory device included in the group Gr2. The input circuit 72 writes the data from the input/output terminals DQA and DQB into the memory cell MC designated by an address, thereby finishing the data writing operation.

In the case of reading data from semiconductor memory devices included in the groups Gr1 and Gr2, the signal generating circuit 630 in the tester 600A generates a control signal of the L level, and the driver 631 converts the control signal of the L level into a predetermined voltage value and outputs the voltage value to the pad 160 of the input selecting circuit 150B. The transfer gates 158 and 159 are turned off. After that, data is read from the memory cell designated by an address, and the output circuit 71 of a semiconductor memory device included in the group Gr1 outputs a signal of the H or L level according to the read data "1" or "0" to the N-channel MOS transistor 151 of the DA converter 150A via the input/output terminal DQA. Similarly, the output circuit 71 of a semiconductor memory device included in the group Gr2 outputs a signal of the H or L level according to the read data "1" or "0" to the N-channel MOS transistor 152 in the DA converter 150A via the input/output terminal DQB.

In this case, when a signal of the L level is supplied to the gate terminals of the N-channel MOS transistors 151 and 152, the N-channel MOS transistors 151 and 152 are turned off, a power supply voltage to be supplied to the power source node 156 is applied to the resistors 153 to 155 connected in series, and the potential on the node 163 becomes the potential of 2.0V. When an L level signal is supplied to the gate terminal of the N-channel MOS transistor 151 and an H level signal is supplied to the gate terminal of the N-channel MOS transistor 152, the N-channel MOS transistor 151 is turned off and the N-channel MOS transistor 152 is turned on. The ground potential is therefore applied to the node 164, the power source voltage is applied across each of the resistors 153 and 154, and the potential on the node 163 becomes 1.5V. Further, when an H level signal is supplied to the gate terminal of the N-channel MOS transistor 151 and an L level signal is supplied to the gate terminal of the N-channel MOS transistor 152, the N-channel MOS transistor 151 is turned on and the N-channel MOS transistor 152 is turned off. The potential on the node 163 therefore becomes equal to that on the node 164, the power source voltage is applied across each of the resistors 153 and 155, and the potential on the node 163 becomes 1.0V. Further, when an H level signal is supplied to the gate terminals of the N-channel MOS transistors 151 and 152, the N-channel MOS transistors 151 and 152 are turned on. The power source voltage is applied across the resistor 153 and the potential on the node 163 becomes 0.5V.

The comparator 634 receives the potential on the node 163 via the pad 162, performs a comparing operation on the received potential, and outputs the result of comparison to the determining circuit 635. The determining circuit 635 determines whether the data pattern read by the above method coincides with the written data pattern or not, thereby finishing the operation test on the semiconductor memory devices included in the groups Gr1 and Gr2.

Only the semiconductor memory devices which have passed the operation test are shipped.

According to the fifth embodiment, data can be simultaneously read from the semiconductor memory devices included in the groups Gr1 and Gr2, so that the time required for the operation test can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells:
   input/output terminals inputting/outputting data;
   an address terminal receiving an address for making each of said plurality of memory cells active;
   a plurality of control terminals provided in correspondence with a plurality of control signals, for receiving said plurality of control signals;
   an activating/inactivating circuit receiving said plurality of control signals and outputting an activation signal or an inactivation signal in response to logic of said plurality of control signals;
   an address decoder decoding an address supplied via said address terminal on the basis of said activation signal and making each of said plurality of memory cells active on the basis of the decoded address; and
   an input/output circuit for inputting/outputting data to/from the memory cell activated by said address decoder on the basis of said activation signal.

2. The semiconductor memory device according to claim 1, wherein said activating/inactivating circuit outputs said activation signal when all of said plurality of control signals have a first logic, and outputs said inactivation signal when at least one of said plurality of control signals has a second logic.

3. The semiconductor memory device according to clam 2, wherein, in normal operation, said activating/inactivating circuit outputs said activation signal or said inactivation signal in response to the logic of one of said plurality of control signals.

4. The semiconductor memory device according to claim 3, wherein said activating/inactivating circuit outputs said activation signal or said inactivation signal by performing an operation to obtain a logical product of said plurality of control signals.

5. The semiconductor memory device according to claim 4, wherein said plurality of control signals are a chip enable signal as one of said control signals and a selection signal, and
   said selection signal is held in said first logic.

6. The semiconductor memory device according to claim 1, wherein said input/output circuit includes an output circuit for outputting output data from each of said plurality of memory cells as a digital signal.

7. A semiconductor memory device comprising:
   a plurality of memory cells:
   input/output terminals for inputting/outputting data;
   an address terminal receiving an address for making each of said plurality of memory cells active;
   a first control terminal for receiving a first control signal;
   a second control terminal for receiving a second control signal;
   an activating/inactivating circuit for receiving said second control signal as a logical signal when said first control signal has a first logic and outputting an activation signal or an inactivation signal in response to the logic of said second control signal,
   for receiving said second control signal as an analog signal when said first control signal has a second logic and outputting said activation signal or said inactivation signal in response to the value of said analog signal;

an address decoder decoding an address supplied via said address terminal on the basis of said activation signal and making each of said plurality of memory cells active on the basis of the decoded address; and an input/output circuit inputting/outputting data to/from the memory cell activated by said address decoder on the basis of said activation signal.

8. The semiconductor memory device according to claim 7, wherein said activating/inactivating circuit includes:

a selection signal generating circuit generating a selection signal of a first or second logic in response to the value of said analog signal;

a selecting circuit selecting said second control signal as said logic signal when said first control signal has said first logic and selecting said selection signal when said first control signal has said second logic; and a signal outputting circuit outputting said activation signal when said selected second control signal or selection signal has the first logic, and outputting said inactivation signal when said selected second control signal or selection signal has the second logic.

9. The semiconductor memory device according to claim 8, wherein said selection signal generating circuit comprises:

an AD converter converting said analog signal to a digital signal having a digital value which varies in response to the value of said analog signal; and a decoding circuit for generating said selection signal on the basis of said digital signal.

10. The semiconductor memory device according to claim 7, wherein said first control signal is held in said first logic in normal operation.

11. The semiconductor memory device according to claim 7, wherein said input/output circuit includes an output circuit outputting output data from each of said plurality of memory cells as a digital signal.

12. A semiconductor wafer including a plurality of first semiconductor memory devices arranged in the (2n−1)th row (where n is a natural number), a plurality of second semiconductor memory devices arranged in the 2n-th row, and cutting areas, wherein each of said plurality of first semiconductor memory devices comprises:

a plurality of first memory cells;

a first input/output terminal for inputting/outputting data;

a first address terminal receiving an address for making each of said plurality of first memory cells active;

a first control terminal receiving a first control signal for generating an activation signal at the time of writing said data;

a second control terminal receiving a second control signal for generating an activation signal at the time of reading said data;

a first activating/inactivating circuit outputting an activation or inactivation signal in response to the logic of said first or second control signal;

a first address decoder decoding an address received via said address terminal on the basis of said activation signal and activating each of said plurality of memory cells on the basis of the decoded address; and a first input/output circuit for inputting/outputting data from/to a memory cell activated by said address decoder on the basis of said activation signal, and each of said plurality of second semiconductor memory devices comprises:

a plurality of second memory cells;

a second input/output terminal for receiving/outputting data;

a second address terminal receiving an address for making each of said plurality of second memory cells active;

third control terminal connected to said second control terminal by an interconnection via said cutting area;

a second activating/inactivating circuit outputting an activation signal or an inactivation signal in response to logic of said second control signal;

a second address decoder decoding an address supplied via said address terminal on the basis of said activation signal and making each of said plurality of memory cells active on the basis of the decoded address; and a second input/output circuit inputting/outputting data to/from the memory activated by said address decoder on the basis of said activation signal.

13. The semiconductor wafer according to claim 12, wherein said first activating/inactivating circuit outputs said activation signal when said first control signal has a first logic or when said second control signal has a first logic, and said second activating/inactivating circuit outputs said activation signal when said second control signal has a second logic.

14. The semiconductor wafer according to claim 13, wherein said first activating/inactivating circuit outputs said inactivation signal when said first and second control signals have a second logic, and said second activating/inactivating circuit outputs said inactivation signal when said second control signal has a first logic.

15. A semiconductor wafer having a plurality of areas each including a plurality of semiconductor memory devices, and a cutting area, wherein said cutting area including a selection signal generating circuit for generating a selection signal for activating a plurality of semiconductor memory devices included in each of said plurality of areas in response to logic of a plurality of first control signals, and each of said plurality of semiconductor memory devices comprises:

a plurality of memory cells;

an input/output terminal for inputting/outputting data;

an address terminal receiving an address for making each of said plurality of first memory cells active;

a control terminal receiving said selection signal generated by said selection signal generating circuit;

an activating/inactivating circuit receiving said selection signal and outputting an activation or inactivation signal in response to the logic of said selection signal;

an address decoder decoding an address received via said address terminal on the basis of said activation signal and activating each of said plurality of memory cells on the basis of the decoded address; and an input/output circuit for inputting/outputting data from/to a memory cell activated by said address decoder on the basis of said activation signal.

16. The semiconductor wafer according to claim 15, wherein said selection signal generating circuit generates selection signals of the number corresponding to said plurality of areas.

17. The semiconductor wafer according to claim 16, wherein, at the time of writing data, said selection signal generating circuit generates said selection signal so as to simultaneously make all of semiconductor memory devices active, and at the time of reading data, generates said selection signal so as to make a plurality of semiconductor memory devices included in each of said plurality of areas on the area unit basis.

18. The semiconductor wafer according to claim 15, wherein said activating/inactivating circuit outputs said activation signal when said selection signal has a first logic.

19. The semiconductor wafer according to claim 15, wherein each of said plurality of semiconductor memory devices has one more control terminal for receiving a chip enable signal, and said activating/inactivating circuit outputs said activation signal or said inactivation signal by performing an operation to obtain a logical product of said chip enable signal and said selection signal.

20. A semiconductor wafer having a plurality of semiconductor memory devices each including a plurality of memory cells and a cutting area, wherein each of said plurality of semiconductor memory devices comprises:

an output circuit outputting read data from said plurality of memory cells as a digital signal; and an input circuit writing write data into said plurality of memory cells, and said cutting area including an input/output switching circuit for converting a digital signal from said output circuit into an analog signal, outputting said read data as an analog signal, and supplying said write data to said input circuit.

* * * * *